(12) United States Patent
Goudo

(10) Patent No.: US 7,486,151 B2
(45) Date of Patent: Feb. 3, 2009

(54) SEMICONDUCTOR CIRCUIT FOR USE IN TIMER CIRCUIT OR OSCILLATOR CIRCUIT

(75) Inventor: Shinsuke Goudo, Tokyo (JP)

(73) Assignee: Mitsubishi Denki Kabushiki Kaisha, Chiyoda-Ku, Tokyo (JP)

(*) Notice: Subject to any disclaimer, the term of this patent is extended or adjusted under 35 U.S.C. 154(b) by 407 days.

(21) Appl. No.: 11/260,174

(22) Filed: Oct. 28, 2005

(65) Prior Publication Data

US 2006/0126238 A1    Jun. 15, 2006

(30) Foreign Application Priority Data

Dec. 10, 2004    (JP) .............................. 2004-357869

(51) Int. Cl.
*H03K 3/02*    (2006.01)
(52) U.S. Cl. .................. 331/143; 331/111; 331/175; 331/36 C; 331/135
(58) Field of Classification Search .................. 331/135, 331/175, 36 C, 111, 143
See application file for complete search history.

(56) References Cited

U.S. PATENT DOCUMENTS 5,841,827 A    11/1998   Chevallier 6,326,859 B1 *  12/2001  Goldman et al. ............ 331/143
6,441,463 B2    8/2002   Yasuda
6,856,566 B2    2/2005   Takahashi et al.

FOREIGN PATENT DOCUMENTS

JP        2002-16254        1/2002
JP        2002-117671       4/2002

OTHER PUBLICATIONS

Korean Office Action dated Apr. 20, 2007.
German Office Action dated Dec. 18, 2007 with English Translation.

* cited by examiner

*Primary Examiner*—Arnold Kinkead
(74) *Attorney, Agent, or Firm*—Buchanan Ingersoll & Rooney PC

(57) ABSTRACT

In a timer circuit of a semiconductor circuit including a current source driven by a power supply voltage, the current source outputs a current dependent on the power supply voltage, and outputs a reference voltage obtained when the power supply voltage is dropped by a predetermined drop voltage. A capacitor is charged with electric charges by the current outputted from the current source. The comparator compares a voltage across the capacitor with the reference voltage from the current source, and outputs an output signal when a voltage across the capacitor is equal to or higher than the reference voltage. The timer circuit outputs an output signal after a delay time, from a timing when supply of the power supply voltage is started, to a timing when the voltage across the capacitor rises substantially in proportion to an elapsed time by charging the capacitor and reaches the reference voltage.

13 Claims, 20 Drawing Sheets

SEMICONDUCTOR CIRCUIT FOR USE IN TIMER CIRCUIT OR OSCILLATOR CIRCUIT

BACKGROUND OF THE INVENTION

1. Field of the Invention

The present invention relates to a semiconductor circuit, in particular, to a semiconductor circuit for use in various kinds of circuits such as a timer circuit, an oscillator circuit, or the like, which is formed by, for example, a CMOS circuit.

2. Description of the Related Art

For example, the Japanese patent laid-open publication No. JP-P2002-117671-A discloses not only a timer circuit but also a semiconductor memory including the timer circuit. In order to provide a timer circuit, a timer cycle of which tends to decrease as the temperature increases, and tends to increases as the temperature deceases, the timer circuit has the following configuration. A diode D has a temperature-dependent current characteristic, and a forward current of the diode D flows into an n type MOS transistor N1 that constitutes a primary side of a current mirror. A current flowing into a p type MOS transistor P2 and an n type MOS transistor N3 that constitute a secondary side of the current mirror is determined depending on the current flowing into the n type MOS transistor N1. The current flowing into the p type MOS transistor P2 and the n type MOS transistor N3 is supplied as an operating current of a ring oscillator which is constituted by inverters I1 to I3. Therefore, a cycle or period (timer cycle) of a clock signal CLK outputted from the present ring oscillator is influenced by the temperature characteristic of the diode D, so that the timer cycle decreases as the temperature rises.

However, in conventionally known timer circuits including the timer circuit disclosed in the Japanese patent laid-open publication No. JP-P2002-117671-A, there is such a problem that the circuit may stop operating when the power supply voltage itself is dropped.

SUMMARY OF THE INVENTION

An essential object of the present invention is to dissolve the above-mentioned problems, and to provide a semiconductor circuit of either a timer circuit or an oscillator circuit, capable of operating stably within a wide range of the power supply voltage from a lower voltage.

In order to achieve the aforementioned objective, according to the present invention, there is provided a semiconductor circuit including a current source, a capacitor, and a comparator. The current source is driven by a power supply voltage. The current source outputs a current dependent on the power supply voltage, and the current source outputs a reference voltage as obtained when the power supply voltage is dropped through a dropping resistance by a predetermined drop voltage. The capacitor is charged with electric charges by the current outputted from the current source. The comparator compares a voltage across the capacitor with the reference voltage outputted from the current source, and outputs an output signal when a voltage across the capacitor is equal to or higher than the reference voltage.

The semiconductor circuit constitutes a timer circuit that outputs an output signal after a delay time that is equal to such a time as, from a timing when supply of the power supply voltage is started, to a timing when the voltage across the capacitor rises substantially in proportion to an elapsed time by charging the capacitor and reaches the reference voltage.

According to the semiconductor circuit according to the present invention, the capacitor is charged with electric charges by using the current source that is driven by the power supply voltage, that outputs the current dependent on the power supply voltage, and that outputs a reference voltage as obtained when the power supply voltage is dropped through a dropping resistance by a predetermined drop voltage. The comparator compares the voltage across the capacitor with the reference voltage outputted from the current source, and outputs the output signal when the voltage across the capacitor is equal to or higher than the reference voltage. The timer circuit outputs the output signal after the delay time which is a time, from a timing when supply of the power supply voltage is started, to a timing when the voltage across the capacitor rises substantially in proportion to the elapsed time by charging the capacitor and reaches the reference voltage.

Accordingly, even when the power supply voltage decreases, the charging current dependent on the power supply voltage decreases, and the reference voltage decreases which is a voltage as obtained when the power supply voltage is dropped through the dropping resistance by the drop voltage. In this case, the delay time hardly changes which is such a time as, from the timing when the voltage across the capacitor rises substantially in proportion to the elapsed time by charging the capacitor, to a timing when the same voltage reaches the reference voltage. In other words, even when the power supply voltage decreases, the semiconductor circuit can operate with keeping the delay time of the timer circuit. Accordingly, the present invention can provide the timer circuit capable of operating stably within a wide range of the power supply voltage from a lower voltage.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described hereinafter with reference to the drawings. Components similar to each other are denoted by the same numerical references, respectively.

First Preferred Embodiment

Figure 1:
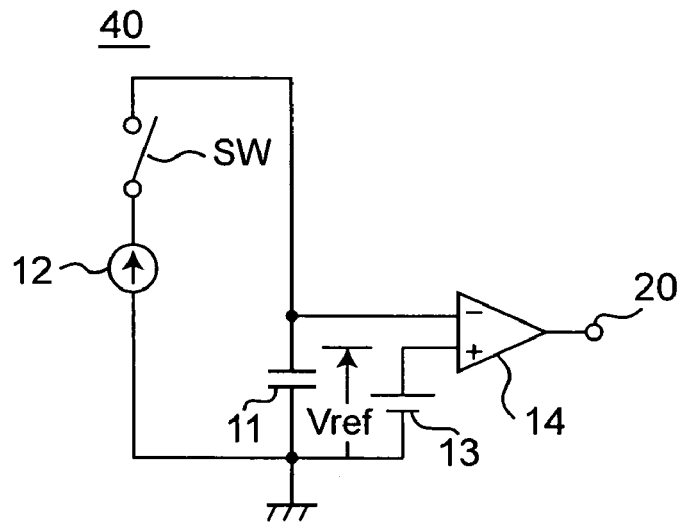
FIG. 1 is a circuit diagram showing a configuration of a timer circuit 40 of a semiconductor circuit according to a first preferred embodiment of the present invention.

FIG. 1 is a circuit diagram showing a configuration of a timer circuit 40 of a semiconductor circuit according to a first preferred embodiment of the present invention.

Referring to FIG. 1, the timer circuit 40 is constituted by including a current source 12, a switch SW that turns on and off supply of a current from the current source 12, a capacitor 11 charged with electric charges by the current, a reference voltage source 13, and a comparator 14. The current source 12 is driven by a power supply voltage Vcc, outputs a current dependent on a power supply voltage Vcc, and outputs a reference voltage Vref which is obtained when the power supply voltage Vcc is dropped through dropping resistances by a predetermined drop voltage. One end of the current source 12 is connected to one end of the capacitor 11 via the switch SW, and another end of the current source 12 is grounded. Further, one end of the capacitor 11 is connected to an inverting input terminal of the comparator 14, and another end of the capacitor 11 is grounded. In addition, a positive electrode of the reference voltage source 13 having the reference voltage Vref supplied from the current source 12 is connected to a non-inverting input terminal of the comparator 14, and a negative electrode of the reference voltage source 13 is grounded. An output terminal of the comparator 14 is connected to an output terminal 20. In the comparator 14, when a voltage inputted from an inverting input terminal is equal to or higher than the reference voltage Vref of the reference voltage source 13, an output signal from the comparator 14 falls from a high level such as +5 V or the like into a low level such as 0 V or the like. It is noted that the switch SW is a virtual switch that is turned on when the power supply voltage Vcc is supplied to the timer circuit 40.

In the timer circuit 40 constituted as described above, when the power supply voltage Vcc is supplied to the timer circuit 40 so that the switch SW is turned on in a state in which no electric charge is stored in the capacitor 11, the current flows from the current source 12 into the capacitor 11, and then, the electric charges are stored in the capacitor 11. Thereafter, as the time elapses, the voltage between both ends of the capacitor 11 or the voltage across the capacitor 11 rises substantially in proportion to the elapsed time. Then, when the voltage across the capacitor 11 is equal to or higher than the reference voltage Vref, the signal outputted from the comparator 14 falls from the high level to the low level. In other words, the output signal from the comparator 14 falls from the high level to the low level at a timing delayed by a predetermined time from a timing when the switch SW is turned on by supplying the power supply voltage Vcc to the timer circuit 40, and therefore, this circuit operates as the timer circuit 40.

Concretely, the timer circuit 40 is constituted as follows. The capacitor 11 is charged by using the current source 12, that is driven by the power supply voltage Vcc, outputs the current dependent on the power supply voltage Vcc, and outputs the reference voltage Vref as obtained when the power supply voltage Vcc is dropped through dropping resistances by the predetermined drop voltage. Further, the timer circuit 40 is provided with the comparator 14 for comparing the voltage across the capacitor 11 with the reference voltage Vref outputted from the current source 12. When the voltage across the capacitor 11 is equal to or higher than the reference voltage Vref, the comparator 14 outputs the output signal. In this case, the comparator 14 outputs the output signal after a delay time that is equal to such a time as, from a timing when the supply of the power supply voltage Vcc is started, to a timing when the voltage across the capacitor 11 rises substantially in proportion to the elapsed time by charging the capacitor 11 with electric charges and then reaches the reference voltage Vref. Accordingly, even if the power supply voltage Vcc decreases, the charging current dependent on the power supply voltage Vcc decreases, and the reference voltage Vref decreases which is obtained when the power supply voltage Vcc is dropped through dropping resistances by the predetermined drop voltage decreases. Therefore, the delay time hardly changes which is a time, from a timing when the voltage across the capacitor 11 rises substantially in proportion to the elapsed time by charging the capacitor 11 with the electric charges, to a timing when the voltage across the capacitor 11 reaches the reference voltage Vref. In other words, even if the power supply voltage Vcc decreases, the timer circuit 40 can operate with keeping or holding the delay time of the timer circuit. Accordingly, it is possible to provide the timer circuit 40 that can operate stably in a wide range of the power supply voltage from a lower voltage.

If a circuit is used that supplies a constant current which is not dependent on the power supply voltage Vcc, it is necessary to cascade-connect at least two stages of transistor series circuit with a resistor or an active element such as a diode or the like in order to install the current source 12 within the semiconductor circuit. Further, it is quite difficult to set the lowest operating voltage so as to be lower, and it is difficult to form a timer circuit operating in a wider range of the power supply voltage. In order to solve the problems, the inventors of the present invention propose an implemental example of the timer circuit 40 shown in FIG. 1.

Figure 2:
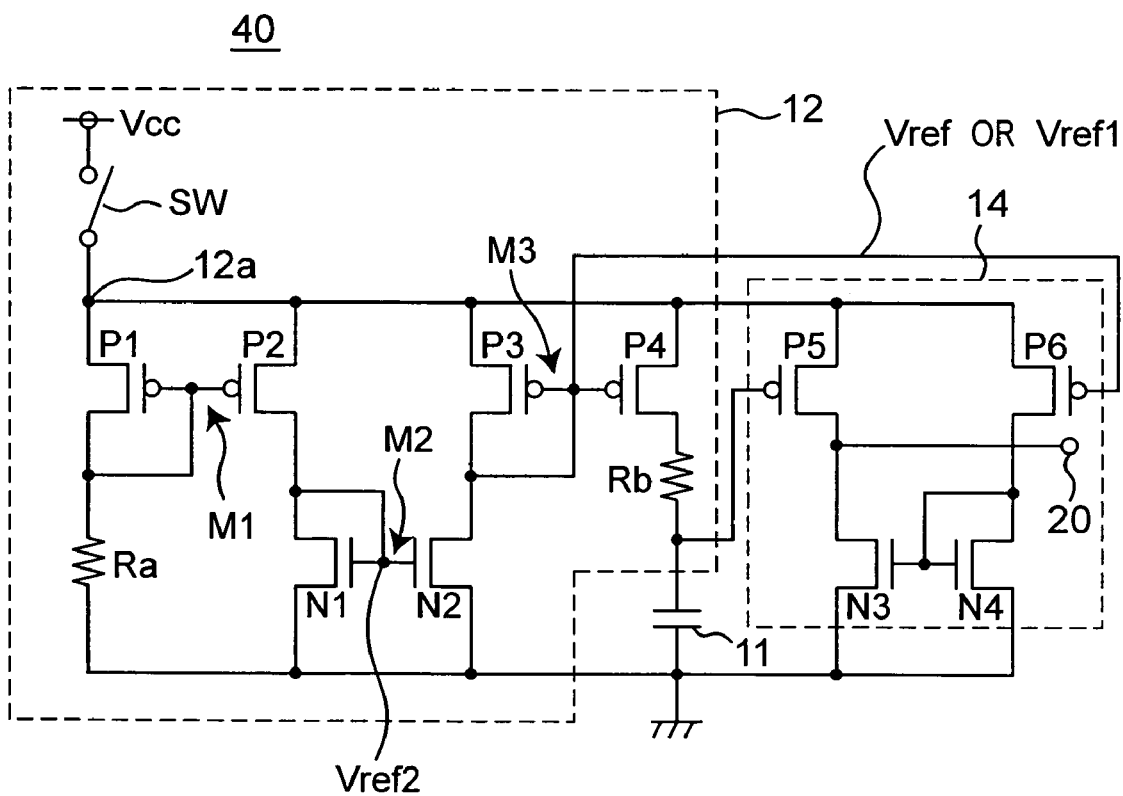
FIG. 2 is a circuit diagram showing an implemental example of the timer circuit 40 shown in FIG. 1.

FIG. 2 is a circuit diagram showing the implemental example of the timer circuit 40 shown in FIG. 1. In FIG. 2, the timer circuit 40 is constituted by including the following:

(a) the current source 12 that includes three current mirror circuits M1, M2 and M3, and resistors Ra and Rb, (b) the capacitor 11, and (c) the comparator 14.

Each of the current source 12 and the comparator 14 is formed by a CMOS circuit.

Referring to FIG. 2, the current source 12 is constituted by including the switch SW, four P channel MOSFETs P1 to P4, two N channel MOSFETs N1 and N2, and the two resistors Ra and Rb. In this case, a pair of P channel MOSFETs P1 and P2 constitute the current mirror circuit M1, a pair of N channel MOSFETs N1 and N2 constitute the current mirror circuit M2, and a pair of P channel MOSFETs P3 and P4 constitute the current mirror circuit M3. These three current mirror circuits M1, M2 and M3 are cascade-connected to each other. In addition, the comparator 14 is constituted by including two P channel MOSFETs P5 and P6, and two N channel MOSFETs N3 and N4.

The power supply voltage Vcc is connected to a power supply connection point 12a via the switch SW. The power supply connection point 12a is connected to a source of each of the six P channel MOSFETs P1 to P6. All the sources of the four N channel MOSFETs N1 to N4 are grounded. The gates of the P channel MOSFETs P1 and P2 are connected to each other, is connected to the drain of the P channel MOSFET P1, and is grounded via the resistor Ra. Further, the drain of the P channel MOSFET P2 is connected to the drain and the gate of the N channel MOSFET N1 and the gate of the N channel MOSFET N2. The gates of the three P channel MOSFETs P3, P4 and P6 are connected to each other, is connected to the drain of the P channel MOSFET P3, and is connected to the drain of the N channel MOSFET N2. The drain of the P channel MOSFET P4 is connected to the gate of the P channel MOSFET P5 via the resistor Rb, and is grounded via the capacitor 11. In addition, the drain of the P channel MOSFET P5 is connected to the drain of the N channel MOSFET N3, and is connected to the output terminal 20. Further, the drain of the P channel MOSFET P6 is connected to not only the drain and the gate of the N channel MOSFET N4 but also the gate of the N channel MOSFET N3.

In the timer circuit 40 constituted as described above as shown in FIG. 2, the current source 12 is constituted by (a) the current mirror circuit M1 which is constituted by the two P channel MOSFETs P1 and P2, (b) the current mirror circuit M2 which is constituted by the two N channel MOSFETs N1 and N2, (c) the current mirror circuit M3 which is constituted by the two P channel MOSFETs P3 and P4, and (d) the two resistors Ra and Rb. Further, the comparator 14 is constituted by the two P channel MOSFETs P5 and P6, and the two N channel MOSFETs N3 and N4.

In the timer circuit 12 shown in FIG. 2, when the power supply voltage Vcc is applied to the timer circuit 12 and the switch SW is turned on, the current flows from the power supply voltage Vcc into the ground via the P channel MOSFET P1 and the resistor Ra. At that time, the voltage induced between the both ends of the resistor Ra or the voltage across the resistor Ra becomes such a voltage as obtained when the power supply voltage Vcc is dropped through the dropping resistance by the threshold voltage of the P channel MOSFET P1 including a diode connection. Then, the current flowing in the resistor Ra is substantially in proportion to the power supply voltage Vcc, namely, it is dependent on the power supply voltage Vcc. This current is used so that it is transmitted to the gate of the P channel MOSFET via (a) the current mirror circuit M1 which is constituted by the paired P channel MOSFETs P1 and P2, (b) the current mirror circuit M2 which is constituted by the paired N channel MOSFETs N1 and N2, and (c) the current mirror circuit M3 which is constituted by the paired P channel MOSFETs P3 and P4, and then, a charging current is obtained which flows from the power supply voltage Vcc into the capacitor 11 via the P channel MOSFET P4 and the resistor Rb. Accordingly, the charging current becomes dependent on the power supply voltage Vcc, and becomes substantially in proportion to the power supply voltage Vcc. In this case, by adjusting the respective gate widths of the MOSFETs of the current mirror circuits M1, M2 and M3, the charging current as desired by the user can be obtained.

Further, the reference voltage Vref is obtained from the gate electric potentials of the paired P channel MOSFETs P3 and P4 that constitute the current mirror circuit M3. The reference voltage Vref is obtained when the power supply voltage Vcc is dropped through the dropping resistance by the threshold voltages of the P channel MOSFETs P3 and P4, and the reference voltage Vref decreases as the power supply voltage Vcc decreases. In the preferred embodiments as described later, the reference voltage Vref can be used as a first reference voltage Vref1, and the gate electric potentials of the paired N channel MOSFETs N1 and N2 of the current mirror circuit M2 (each of which is a threshold voltage of each of the MOSFETs N1 and N2) can be used as a second reference voltage Vref2 lower than the first reference voltage Vref1.

The thus obtained current dependent on the power supply voltage Vcc proceeds charging of the capacitor 11, and thereafter, when the electric potential of the inverting input terminal of the comparator 14 (namely, the electric potential of the gate of the P channel MOSFET P5) becomes equal to or higher than the reference voltage Vref, the voltage of the output terminal 20 is inverted, from the high level which is the level of the power supply voltage, to the low level which is the electric potential of the ground.

At that time, the electric potential of the reference voltage Vref (the gate electric potential of each of the P channel MOSFETs P3 and P4) can be made equal to the gate electric potential of the P channel MOSFET P1 as long as a transistor is constituted so that such a channel length modulation effect can be neglected that an effective channel length is changed by changing the voltage between the drain and the source of the transistor. Therefore, according to the present circuit configuration as described above, the inversion of the voltage of the output terminal 20 occurs when the voltage across the capacitor 11 charged with electric charges by using the charging current dependent on the power supply voltage Vcc reaches the reference voltage Vref which is the voltage as obtained when the power supply voltage Vcc is dropped through the dropping resistance by the threshold voltage of the P channel MOSFET P1. As long as the threshold voltages of the respective MOSFETs are constant, even when the power supply voltage Vcc decrease, the charging current dependent on the power supply voltage Vcc also decreases, and the reference voltage Vref also decreases which is obtained when the power supply voltage Vcc is dropped through the dropping resistance by the drop voltage. Therefore, the delay time hardly changes which is such a time as, from a timing when the voltage across the capacitor 11 rises substantially in proportion to the elapsed time by charging of the capacitor 11, to a timing when the voltage across the capacitor 11 reaches the reference voltage Vref. In other words, the delay time, from a timing when the power supply is turned on, to a timing when the voltage of the output terminal 20, is logically inverted is less influenced by the change in the power supply voltage Vcc. In addition, since the generator source of the charging current is constituted by one P channel MOSFET P1 and one resistor Ra, the timer circuit 40 can be started at a relatively low voltage. In other words, even if the power supply voltage Vcc decreases, the timer circuit 40 can operate with keeping or holding the delay time thereof, and there can be provided the timer circuit 40, capable of operating stably in the wide range of the power supply voltage from the lower voltage.

Figure 3:
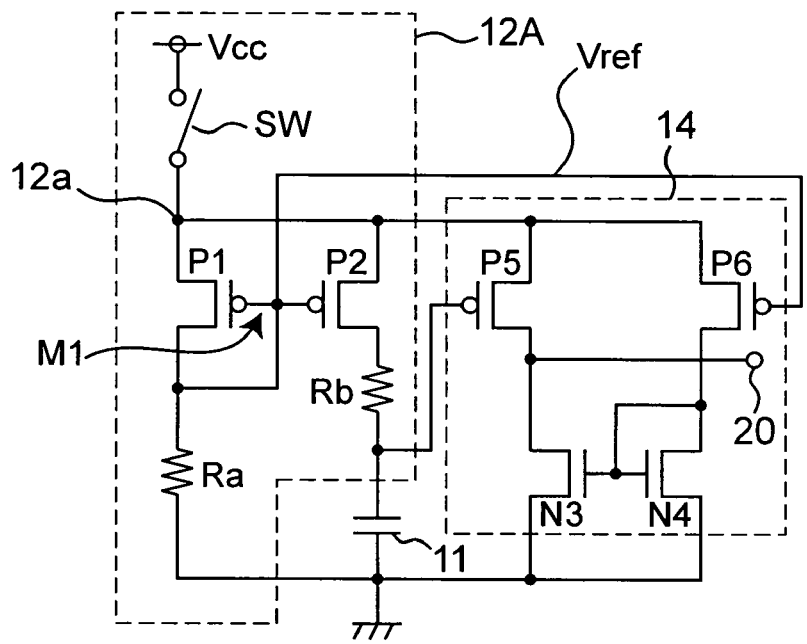
FIG. 3 is a circuit diagram showing a modified preferred embodiment 40A of the timer circuit 40 shown in FIG. 2.

FIG. 3 is a circuit diagram showing a modified preferred embodiment 40A of the timer circuit 40 shown in FIG. 2. The timer circuit 40A shown in FIG. 3 is characterized, as compared with the timer circuit 40 shown in FIG. 2, in that the current mirror circuits M2 and M3 are not provided in the current source 12.

Referring to FIG. 3, the difference therebetween will be described. A charging current flows from the power supply voltage Vcc into the capacitor 11 via the P channel MOSFET P2 and the resistor Rb. Even with such a configuration, the timer circuit 40A shown in FIG. 3 operates in a manner similar to that of the timer circuit 40 shown in FIG. 2.

Figure 4:
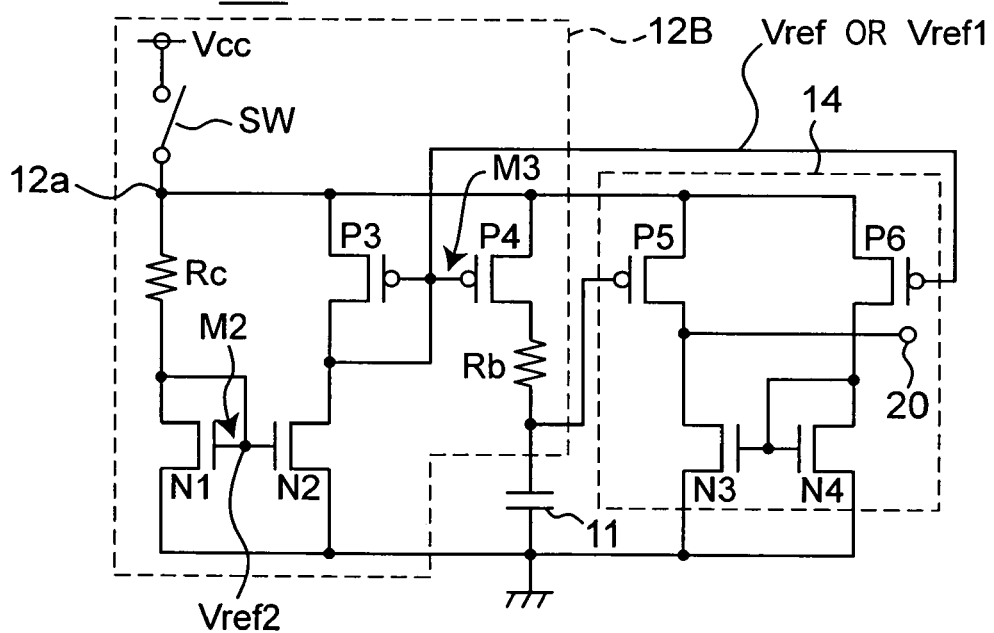
FIG. 4 is a circuit diagram showing a further implemental example 40B of the timer circuit 40 shown in FIG. 1.

FIG. 4 is a circuit diagram showing a further implemental example 40B of the timer circuit 40 shown in FIG. 1. The timer circuit 40B shown in FIG. 4 is characterized, as compared with the timer circuit 40 shown in FIG. 2, in that the circuit which is constituted by two P channel MOSFETs P1 and P2 and one resistor Ra is replaced by a circuit which is constituted by one resistor Rc. Even with such a configuration, the timer circuit 40B shown in FIG. 4 operates in a manner similar to that of the timer circuit 40 shown in FIG. 2.

As described above, according to the semiconductor circuit according to the first preferred embodiment of the present invention, even when the power supply voltage Vcc decreases, the charging current dependent on the power supply voltage Vcc decreases, and the reference voltage Vref also decreases which is obtained when the power supply voltage Vcc is dropped through the dropping resistance by the drop voltage. Therefore, the delay time hardly changes which is a time, from a timing when the voltage across the capacitor 11 rises substantially in proportion to the elapsed time by charging of the capacitor 11, to a timing when the voltage across the capacitor 11 reaches the reference voltage Vref. In other words, even if the power supply voltage Vcc decreases, the timer circuit 40 can operate with keeping or holding the delay time. Accordingly, it is possible to provide the timer circuits 40, 40A and 40B capable of stably operating in the wide range of the power supply voltage from the lower voltage.

Second Preferred Embodiment

Figure 5:
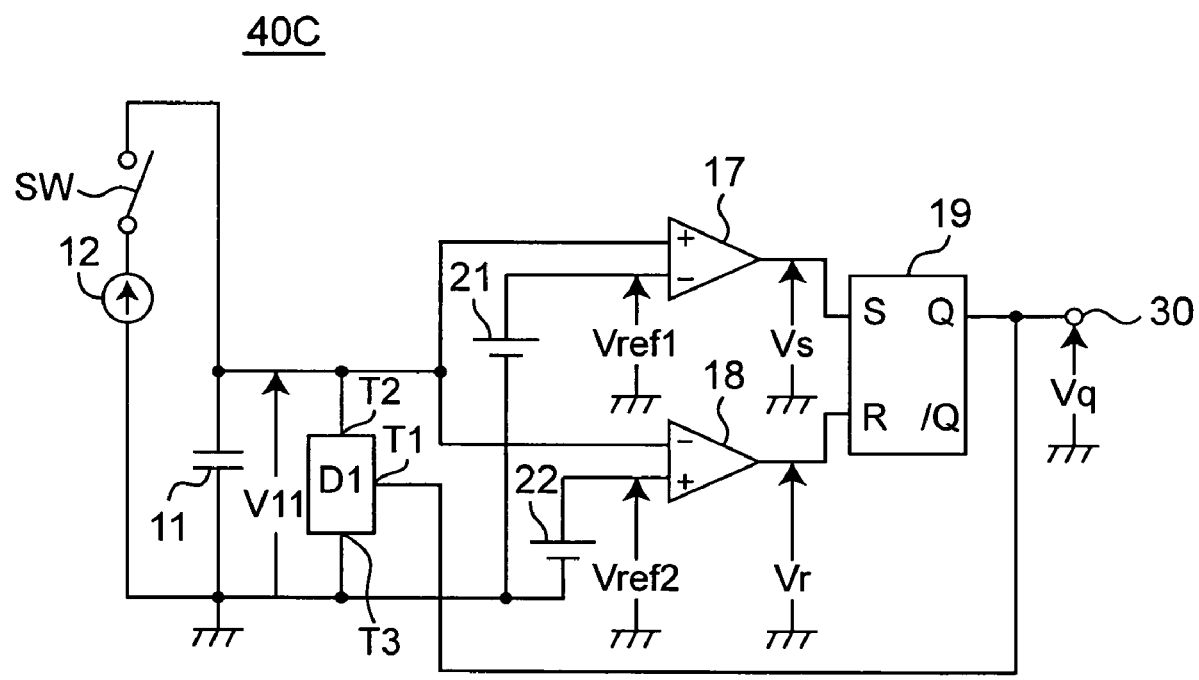
FIG. 5 is a circuit diagram showing a configuration of an oscillator circuit 40C of a semiconductor circuit according to a second preferred embodiment of the present invention.

FIG. 5 is a circuit diagram showing a configuration of an oscillator circuit 40C of a semiconductor device according to a second preferred embodiment of the present invention. The oscillator circuit 40C according to the second preferred embodiment is an oscillator circuit formed by a CMOS circuit based on the timer circuit 40 shown in FIG. 1. It is noted that the third to fifth preferred embodiments relates to oscillator circuits which are formed by a CMOS circuit in a manner similar to that of the second preferred embodiment.

The oscillator circuit 40C of the present preferred embodiment is characterized, as compared with the timer circuit 40 shown in FIG. 1, by being constituted by including the following in place of the comparator 14 including the reference voltage source 13:

(a) a comparator 17 including the reference voltage source 21 having the first reference voltage Vref1;
(b) a comparator 18 including a reference voltage source 22 having the second reference voltage Vref2;
(c) a set-reset flip-flop 19; and
(d) a discharge circuit D1.

It is noted that each of the comparators 17 and 18 and the set-reset flip-flop 19 is formed by, for example, a CMOS circuit. Further, the respective voltages of the reference voltage sources 21 and 22 are also generated by the current source 12 or 12B formed by the CMOS circuit in a manner similar to that of the first preferred embodiment. Concretely, there are used the two reference voltages Vref1 and Vref2 shown in FIGS. 2 and 4.

Referring to FIG. 5, the voltage between both ends of the capacitor 11 or the voltage across the capacitor 11 is denoted by V11, and the terminals T2 and T3 of the discharge circuit D1 are connected to the both ends of the capacitor 11, respectively. One end of the capacitor 11 is connected to the non-inverting input terminal of the comparator 17, and is connected to the inverting input terminal of the comparator 18. The reference voltage Vref1 from the reference voltage source 21 is applied to the inverting input terminal of the comparator 17, and the reference voltage Vref2 from the reference voltage source 22 is applied to the non-inverting input terminal of the comparator 18. Further, a voltage Vs of an output signal outputted from the comparator 17 is inputted to a set terminal S of the set-reset flip-flop 19, and a voltage Vr of an output signal outputted from the comparator 18 is inputted to a reset terminal R of the set-reset flip-flop 19. The set-reset flip-flop 19 includes a non-inverting output terminal Q, and an inverting output terminal /Q ("/" in "/Q" denotes an upper bar, and represents a low active status in the present specification and the drawings). The set-reset flip-flop 19 is set in response to a set signal, and is reset in response to a reset signal. Until the flip-flop 19 is reset after the flip-flop is set, the set-reset flip-flop 19 outputs an output signal Vq from the non-inverting output terminal Q thereof, and outputs an inverted signal of the output signal Vq from the inverting output terminal /Q thereof. The voltage Vq of the output signal from the non-inverting output terminal Q of the set-reset flip-flop 19 is outputted to an output terminal 30, and is applied to a control terminal T1 of the discharge circuit D1 as a discharge start signal.

The comparator 17 outputs a high-level pulse signal when the voltage V11 inputted to the non-inverting input terminal thereof is equal to or higher than the reference voltage Vref1. Further, the comparator 18 outputs a high-level pulse signal when the voltage V11 inputted to the non-inverting input terminal thereof is equal to or lower than the reference voltage Vref2.

Figure 6:
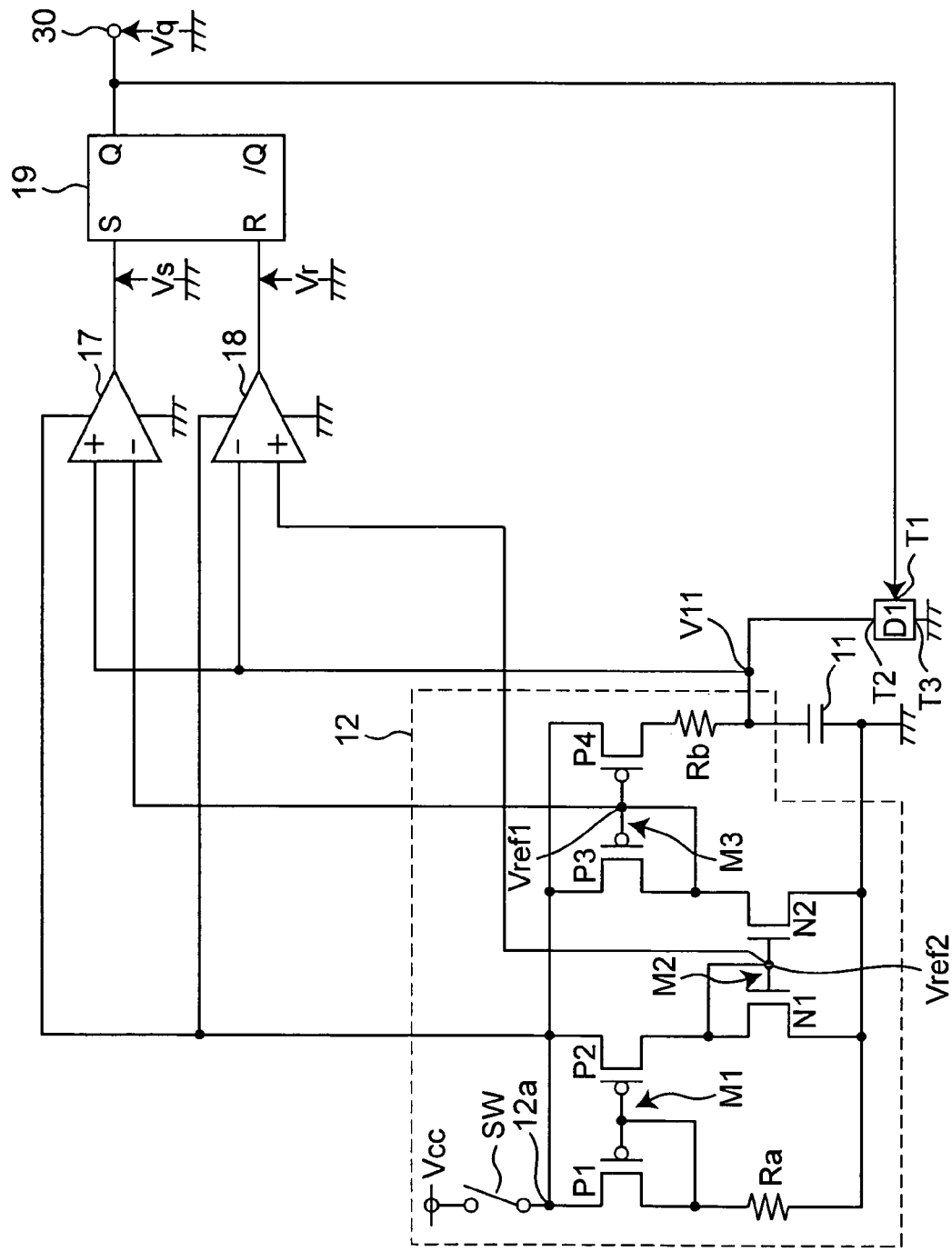
FIG. 6 is a circuit diagram showing a configuration of a first implemental example 40Ca of the oscillator circuit 40C shown in FIG. 5.

FIG. 6 is a circuit diagram showing a configuration of a first implemental example 40Ca of the oscillator circuit 40C shown in FIG. 5. In FIG. 6, the oscillator circuit 40Ca is characterized by being constituted by including the current source 12 shown in FIG. 2, and the two comparators 17 and 18 each having a configuration similar to that of the comparator 14 shown in FIG. 2.

Referring to FIG. 6, the power supply connection point 12a of the current source 12 is connected to a power supply terminal of the comparator 17 so that the power supply voltage Vcc is supplied to the comparator 17, and is also connected to a power supply terminal of the comparator 18 so that the power supply voltage Vcc is supplied to the comparator 18. The gate voltage of each of the P channel MOSFETs P3 and P4 of the current source 12 is applied to the inverting input terminal of the comparator 17 as the reference voltage Vref1, and the gate voltage of each of the N channel MOSFETs N1 and N2 of the current source 12 is applied to the non-inverting input terminal of the comparator 18 as the reference voltage Vref2. The source of the P channel MOSFET P4 of the current source 12 is grounded via the resistor Rb and the capacitor 11. In addition, the voltage V11 between the both ends of the capacitor 11 or the voltage V11 across the capacitor 11 is applied to the non-inverting input terminal of the comparator 17, the inverting input terminal of the comparator 18, and the terminal T2 of the discharge circuit D1. An output signal outputted from the comparator 17 is inputted to the set terminal S of the set-reset flip-flop 19. An output signal outputted from the comparator 18 is inputted to the reset terminal R of the set-reset flip-flop 19. Further, an output signal outputted from the non-inverting output terminal Q of the set-reset flip-flop 19 is inputted to the control terminal T1 of the discharge circuit D1.

Figure 7:
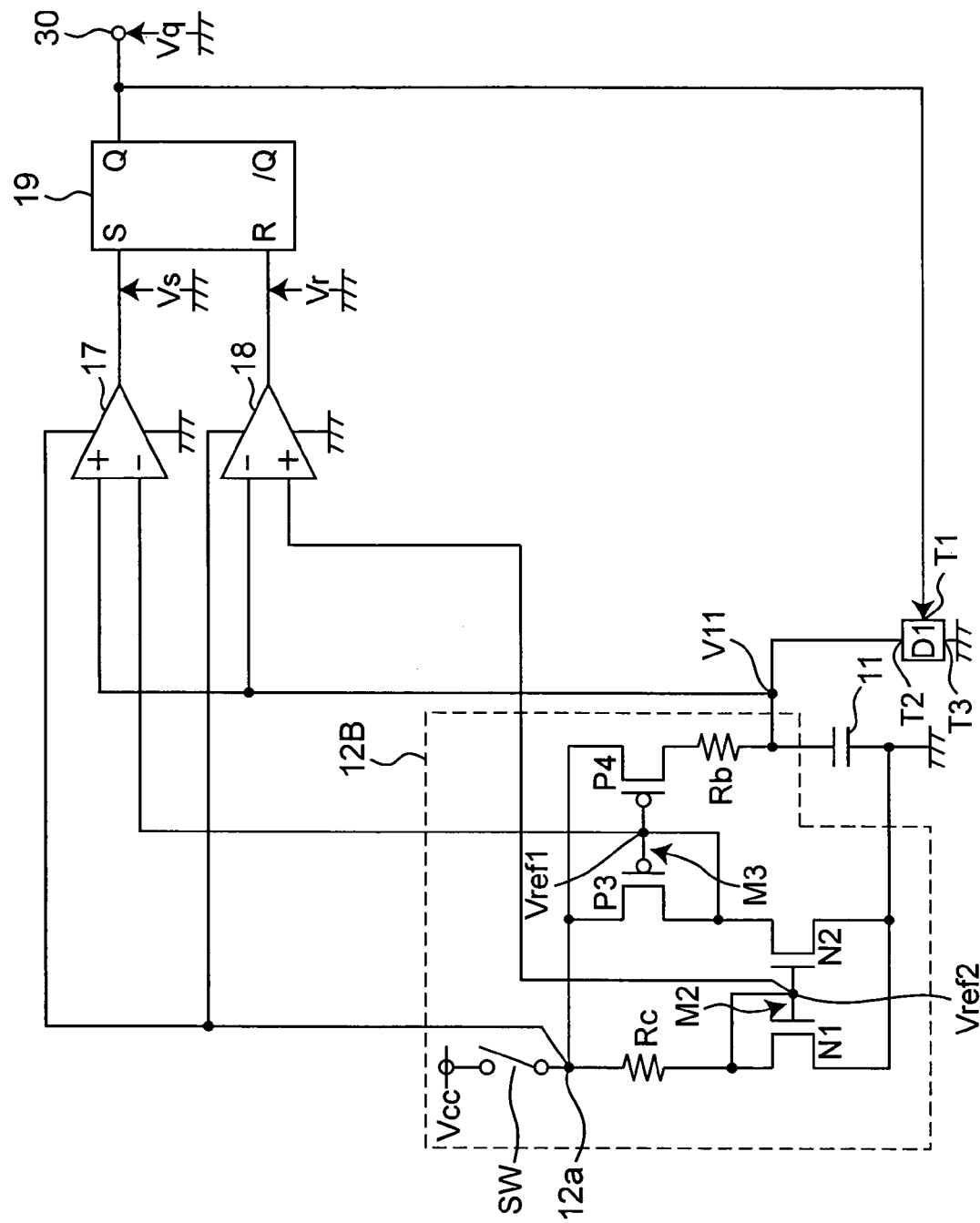
FIG. 7 is a circuit diagram showing a configuration of a second implemental example 40Cb of the oscillator circuit 40C shown in FIG. 5.

FIG. 7 is a circuit diagram showing a configuration of a second implemental example 40Cb of the oscillator circuit 40C shown in FIG. 5. In FIG. 7, the oscillator circuit 40Cb is characterized by being constituted by including a current source 12B shown in FIG. 4, and the two comparators 17 and 18 each having a configuration similar to that of the comparator 14 shown in FIG. 4. In other words, the oscillator circuit 40Cb is constituted, as compared with the oscillator circuit 40Ca shown in FIG. 6, by including the current source 12B shown in FIG. 4 in place of the current source 12 shown in FIG. 2. The other configuration of the oscillator circuit 40Cb is similar to that shown in FIG. 6.

Figure 8:
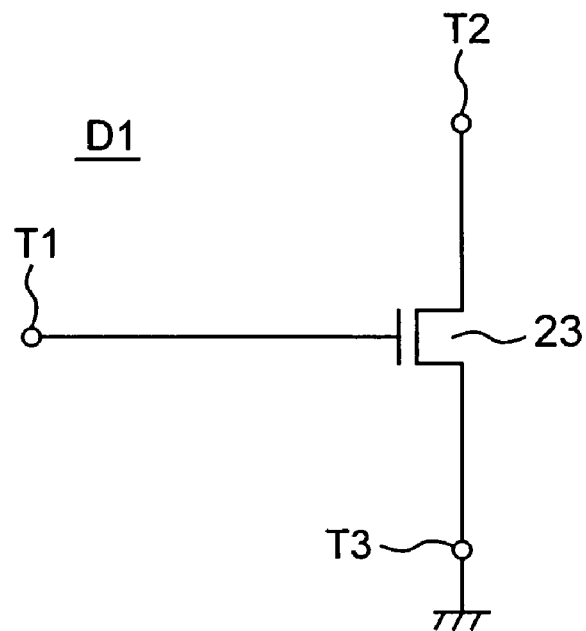
FIG. 8 is a circuit diagram showing a configuration of a discharge circuit D1 shown in FIGS. 5 to 7.

FIG. 8 is a circuit diagram showing a configuration of the discharge circuit D1 shown in FIGS. 5 to 7. As shown in FIG. 8, the discharge circuit D1 is constituted by one N channel MOSFET 23 included in the CMOS circuit. The gate of the N channel MOSFET 23 is connected to the control terminal T1, the drain thereof is connected to the terminal T2, and the source thereof is connected to the grounded terminal T3. In the discharge circuit D1 as thus constituted, when the high-level signal is applied to the gate of the N channel MOSFET 23 via the control terminal T1, the N channel MOSFET 23 is turned on. This leads to constitution of the discharge circuit having a predetermined resistance between the terminals T2 and T3.

Figure 9:
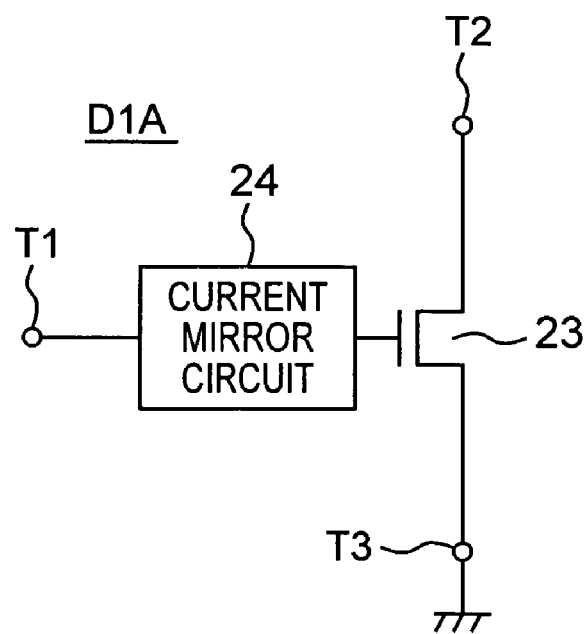
FIG. 9 is a circuit diagram showing a configuration of a modified preferred embodiment D1A of the discharge circuit D1 shown in FIGS. 5 to 7.

FIG. 9 is a circuit diagram showing a configuration of a modified preferred embodiment D1A of the discharge circuit D1 shown in FIGS. 5 to 7. The discharge circuit D1A shown in FIG. 9 is characterized, as compared with the discharge circuit D1 shown in FIG. 8, by being constituted so that a current mirror circuit 24 is interposed between the control terminal T1 and the gate of the N channel MOSFET 23, and a current is generated based on a voltage signal inputted to the control terminal T1 to drive the N channel MOSFET 23 by the current.

Figure 10:
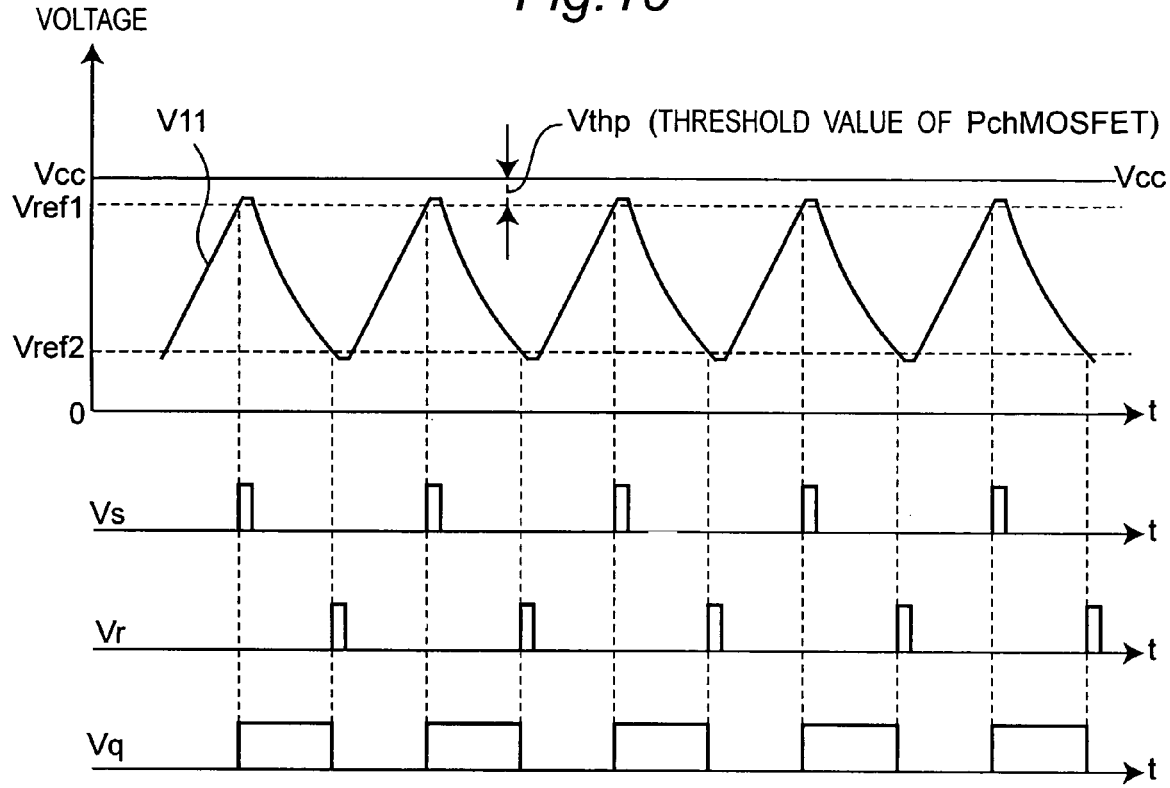
FIG. 10 is a timing chart showing an operation of the oscillator circuit 40C shown in FIG. 5.

FIG. 10 is a timing chart showing an operation of the oscillator circuit 40C shown in FIG. 5. As shown in FIG. 10, in the oscillator circuit 40C shown in FIG. 5, the reference voltage Vref1 is set to a voltage obtained when the power supply voltage Vcc is dropped through the dropping resistance by a threshold voltage Vthp of the P channel MOSFET, and the reference voltage Vref2 is set to a voltage lower than the reference voltage Vref1.

As is obvious from FIG. 10, after the switch SW is turned on, the capacitor 11 is charged with the electric charges, when the voltage V11 between the both ends of the capacitor 11 or the voltage V11 across the capacitor 11 is equal to or higher than the reference voltage Vref1, the comparator 17 outputs the high-level pulse signal. Then, the set-reset flip-flop 19 is set, and the high-level signal Vq is outputted from the non-inverting output terminal Q. At that time, in response to the high-level signal, the electric discharge circuit D1 is turned on, the charges as stored in the capacitor 11 are discharged with a time constant that is determined by a capacitance of the capacitor 11 and a resistance of the N channel MOSFET 23 of the discharge circuit D1. Thereafter, when the voltage between the both ends of the capacitor 11 or the voltage across the capacitor 11 is equal to or lower than the reference voltage Vref2, the comparator 18 outputs the high-level pulse signal to the reset terminal R of the set-reset flip-flop 19. In response to this, the set-reset flip-flop 19 is reset, and then, the signal Vq from the non-inverting output terminal Q changes to the low-level. As a result, the signal applied to the discharge circuit D1 changes to the low-level, so that the discharge circuit D1 is turned off and the discharging of electric charges by the discharge circuit D1 is finished. Next, the charging of the capacitor 11 with electric charges is started, and the above-described operation is repeatedly performed. Therefore, as is obvious from FIG. 10, the high-level signal having a predetermined pulse width is outputted from the output terminal 30 in a predetermined cycle or period, namely, a predetermined oscillation signal is outputted from the output terminal 30.

In the oscillator circuit 40C constituted as described above as shown in FIG. 5, in response to the reset signal, the voltage across the capacitor 11 rises from the second reference voltage Vref2 substantially in proportion to the elapsed time by charging the capacitor 11 and reaches the first reference voltage Vref1. Thereafter, in response to the set signal, the voltage across the capacitor 11 falls from the first reference voltage Vref1 according to the elapsed time by discharging the electric charges from the capacitor 11 and reaches the second reference voltage Vref2. By operating this operation, the output signal from the set-reset flip-flop 19 can be outputted as an oscillation signal having a predetermined cycle.

As described above, the oscillator circuit 40C of the semiconductor circuit according to the second preferred embodiment of the present invention executes the operation of the oscillator circuit including the operation of the timer circuit according to the first preferred embodiment by using the charging current from the current source 12 or 12B according to the first preferred embodiment, and the reference voltage Vref1 from the current source 12 or 12B. Due to this, even if the power supply voltage Vcc decreases, the charging current dependent on the power supply voltage Vcc also decreases, and the reference voltage Vref1 decreases as obtained when the power supply voltage Vcc is dropped through the dropping resistance by the drop voltage decreases. Therefore, the time hardly changes which is a time, from a timing when the voltage across the capacitor 11 rises from the reference voltage Vref2 substantially in proportion to the elapsed time by charging the capacitor 11, to a timing when the voltage across the capacitor 11 reaches the reference voltage Vref1. In other words, the oscillator circuit can operate with keeping or holding the oscillation cycle or period of the oscillator circuit even when the power supply voltage Vcc decreases. Accordingly, it is possible to provide the oscillator circuit that can stably operate in the wide range of the power supply voltage from the lower voltage.

Third Preferred Embodiment

Figure 11:
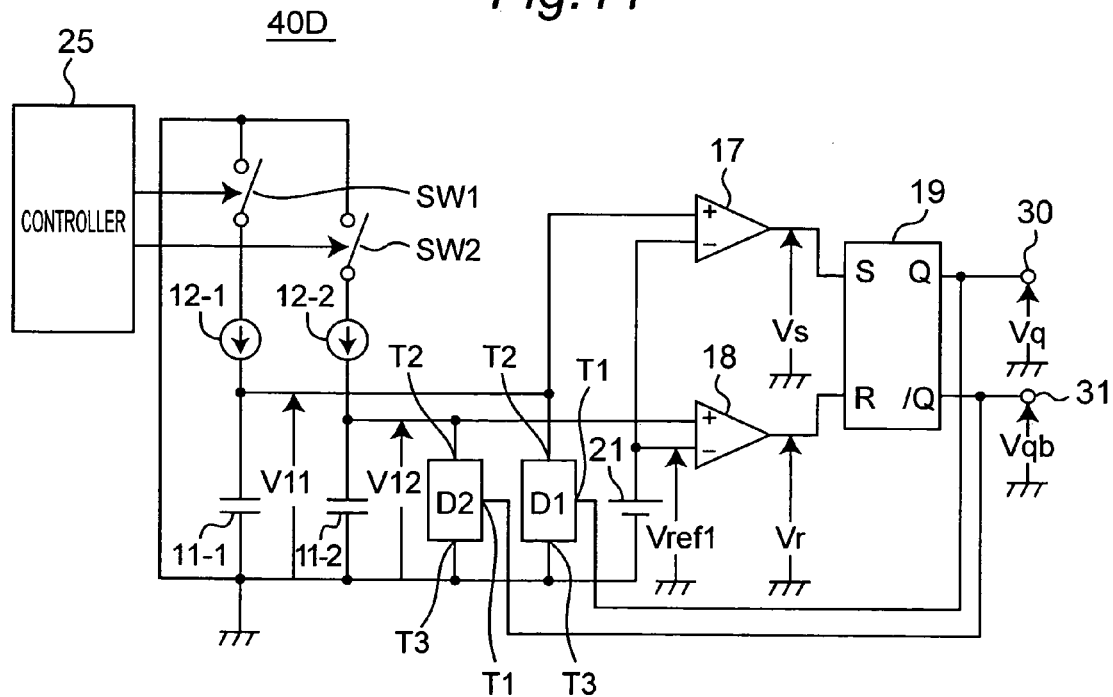
FIG. 11 is a circuit diagram showing a configuration of an oscillator circuit 40D of a semiconductor circuit according to a third preferred embodiment of the present invention.

FIG. 11 is a circuit diagram showing a configuration of an oscillator circuit 40D of a semiconductor circuit according to a third preferred embodiment of the present invention. The oscillator circuit 40D shown in FIG. 11 is characterized, as compared with the oscillator circuit 40C shown in FIG. 5, by including the following:

(a) capacitors 11-1 and 11-2 and discharge circuits D1 and D2 corresponding to two current sources 12-1 and 12-2, respectively;

(b) two switches SW1 and SW2 that turn on and off the operations of the two respective current sources 12-1 and 12-2, and;

(c) a controller 25 that controls these two switches SW1 and SW2 so as to be turned on and off.

In the oscillator circuit 40C shown in FIG. 5 as described above, when the reference voltages Vref1 and Vref2 are set to be substantially equal to each other, the oscillation operation is stopped as is obvious from FIG. 10. The oscillator circuit 40D shown in FIG. 11 dissolves this problem. It is noted that the voltage of the reference voltage source 21 is generated by the current source 12, 12A, or 12B formed by the CMOS circuit in a manner similar to that of the first preferred embodiment. Concretely, the reference voltage source 21 utilizes the reference voltage Vref shown in FIGS. 2 to 4. In addition, the discharge circuits D1 and D2 are constituted in a manner similar to that of the discharge circuit D1 as described above.

Referring to FIG. 11, one end of the current source 12-1 is grounded via the switch SW1, and another end of the current source 12-1 is grounded via the capacitor 11-1. Further, one end of the current source 12-2 is grounded via the switch SW2, and another end of the current source 12-2 is grounded via the capacitor 11-2. The voltage V11 between both ends of the capacitor 11-1 or the voltage V11 across the capacitor 11-1 is applied to the discharge circuit D1 and the non-inverting input terminal of the comparator 17. Further, the voltage V12 between both ends of the capacitor 11-2 or the voltage V12 across the capacitor 11-2 is applied to the discharge circuit D2 and the non-inverting input terminal of the comparator 18. Furthermore, the reference voltage Vref from the reference voltage source 21 is applied to the inverting input terminals of the two comparators 17 and 18. In this case, the comparators 17 and 18 output the high-level pulse signals, respectively, when the voltages V11 and V12 applied to each non-inverting input terminal thereof are equal to or higher than the reference voltage Vref. The output signal outputted from the comparator 17 is outputted as a voltage Vs to the set terminal S of the set-reset flip-flop 19, and the output signal outputted from the comparator 18 is outputted as a voltage Vr to the reset terminal R of the set-reset flip-flop 19. Further, the signal outputted from the non-inverting output terminal Q of the set-reset flip-flop 19 is outputted as a voltage Vq to the output terminal 30 and the control terminal T1 of the discharge circuit D1. Further, the signal outputted from the inverting output terminal /Q of the set-reset flip-flop 19 is outputted as a voltage Vqb to the output terminal 31 and the control terminal T1 of the discharge circuit D2. It is noted that the controller 25 turns on the switch SW1 after the oscillator circuit 40D starts operating, and turns on the switch SW2 at a timing delayed by a predetermined time interval therefrom.

Figure 12:
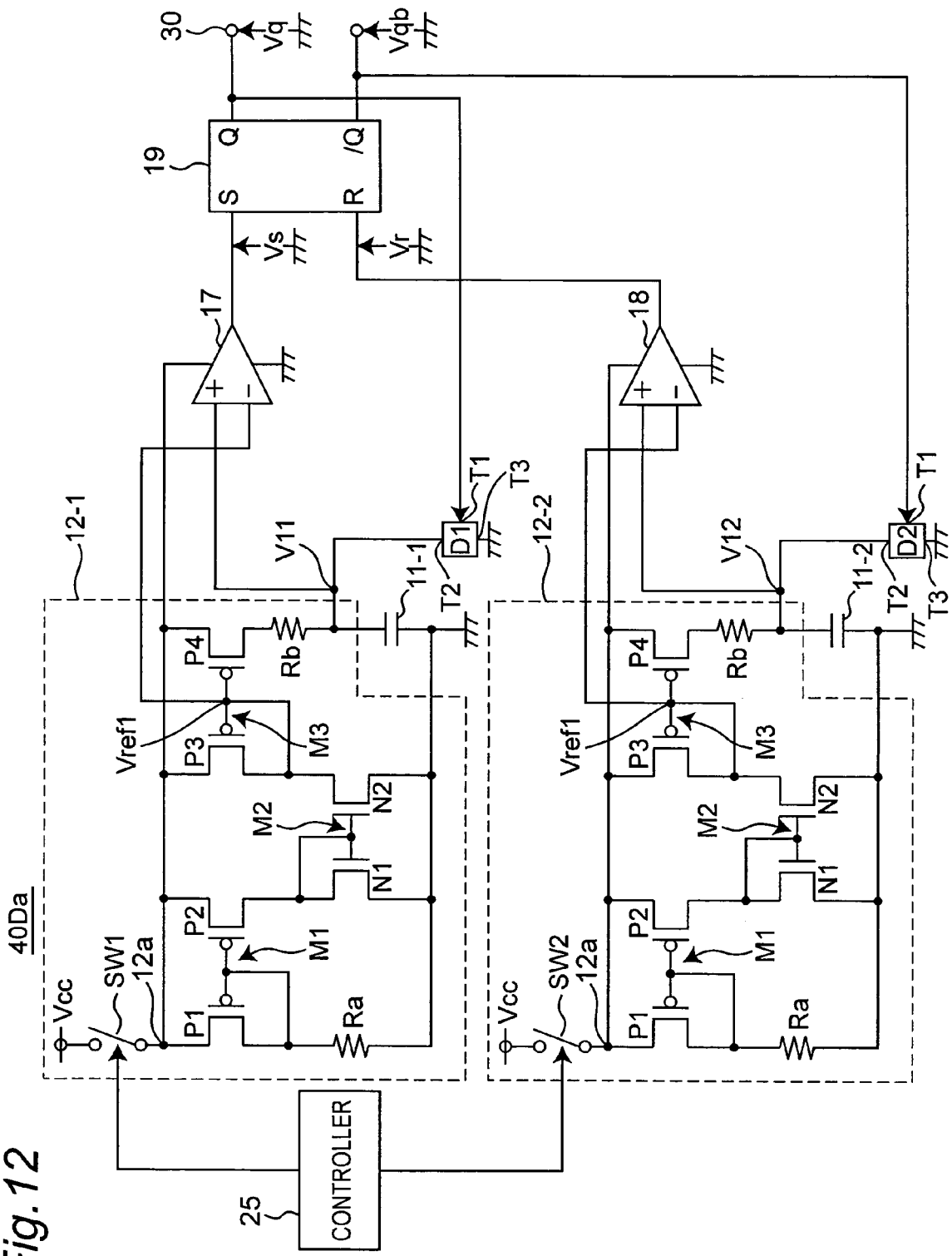
FIG. 12 is a circuit diagram showing a configuration of a first implemental example 40Da of the oscillator circuit 40D shown in FIG. 11.

FIG. 12 is a circuit diagram showing a configuration of a first implemental example 40Da of the oscillator circuit 40D shown in FIG. 11. In FIG. 12, the oscillator circuit 40Da is characterized by being constituted by using (a) the current sources 12-1 and 12-2 each having a configuration similar to that of the current source 12 shown in FIG. 2, and (b) the two comparators 17 and 18 each having a configuration similar to that of the comparator 14 shown in FIG. 2.

Referring to FIG. 12, the current source 12-1 includes the switch SW1 controlled by the controller 25, and the current source 12-2 includes the switch SW2 controlled by the controller 25. The power supply connection point 12a of the current source 12-1 is connected to the power supply terminal of the comparator 17 so that the power supply voltage Vcc is supplied to the comparator 17. Further, the power supply connection point 12a of the current source 12-2 is also connected to the power supply terminal of the comparator 18 so that the power supply voltage Vcc is supplied to the comparator 18. The gate voltage of each of the P channel MOSFETs P3 and P4 of the current source 12-1 is applied to the inverting input terminal of the comparator 17 as the reference voltage Vref1, and the gate voltage of each of the P channel MOSFETs P3 and P4 of the current source 12-2 is applied to the inverting input terminal of the comparator 18 as the reference voltage Vref1. Furthermore, the source of the P channel MOSFET P4 of the current source 12-1 is grounded via the resistor Rb and the capacitor 11-1. In addition, the voltage V11 between the both ends of the capacitor 11-1 or the voltage V11 across the capacitor 11-1 is applied to the non-inverting input terminal of the comparator 17 and the terminal T2 of the discharge circuit D1. The source of the P channel MOSFET P4 of the current source 12-2 is grounded via the resistor Rb and the capacitor 11-2. In addition, the voltage V12 between the both ends of the capacitor 11-2 or the voltage V12 across the capacitor 11-2 is applied to the non-inverting input terminal of the comparator 18 and the terminal T2 of the discharge circuit D2. The signal outputted from the comparator 17 is inputted to the set terminal S of the set-reset flip-flop 19. Further, the output signal outputted from the comparator 18 is inputted to the reset terminal R of the set-reset flip-flop 19. Furthermore, the signal outputted from the non-inverting output terminal Q of the set-reset flip-flop 19 is inputted to the control terminal T1 of the discharge circuit D1, and the output signal outputted from the inverting output terminal /Q of the set-reset flip-flop 19 is inputted to the control terminal T1 of the discharge circuit D2.

Figure 13:
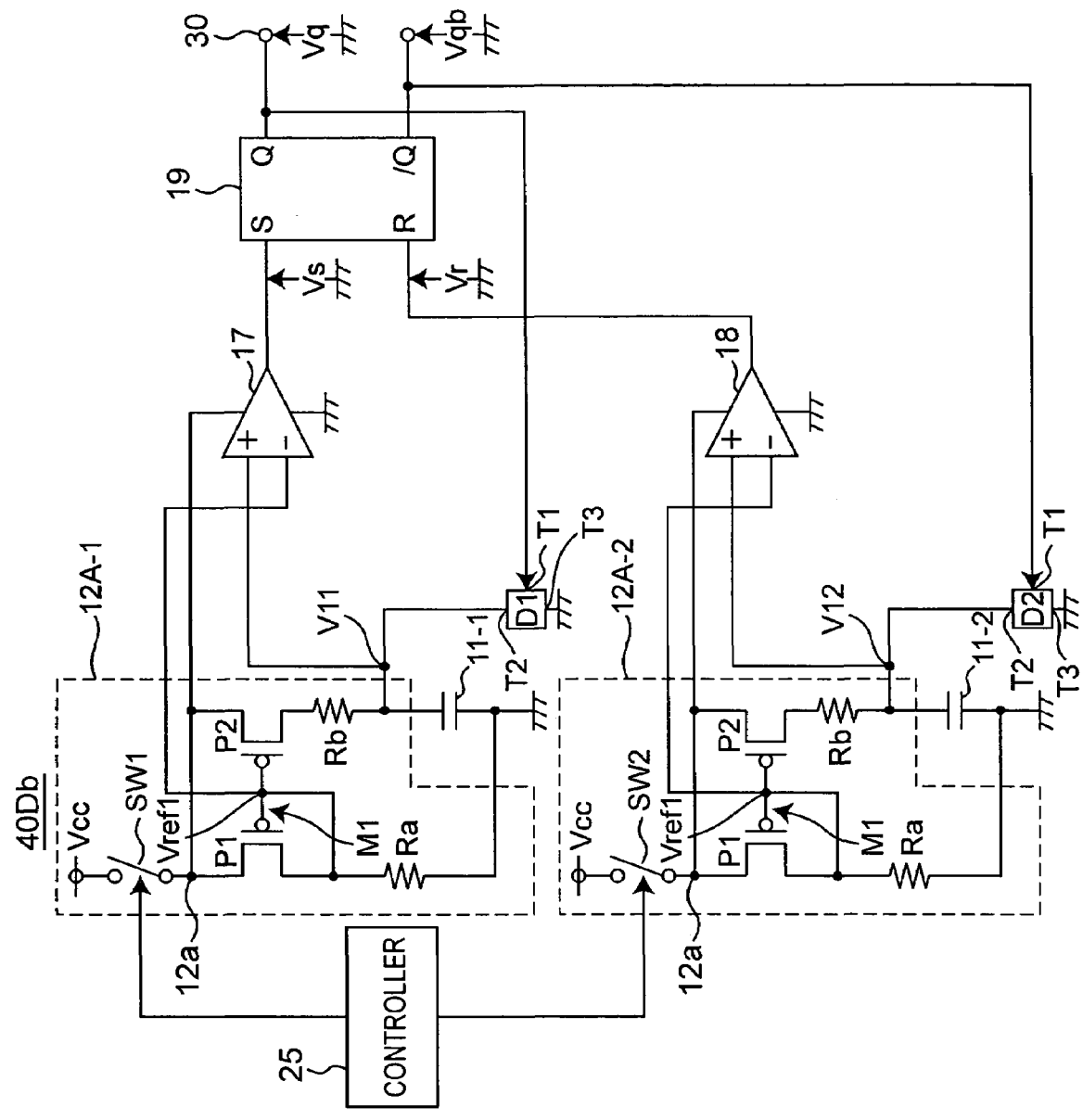
FIG. 13 is a circuit diagram showing a configuration of a second implemental example 40Db of the oscillator circuit 40D shown in FIG. 11.

FIG. 13 is a circuit diagram showing a configuration of a second implemental example 40Db of the oscillator circuit 40D shown in FIG. 11.

Referring to FIG. 13, the oscillator circuit 40Db is characterized by being constituted by using (a) current sources 12A-1 and 12A-2 each having a configuration similar to that of the current source 12A shown in FIG. 3, and (b) the two comparators 17 and 18 each having a configuration similar to that of the comparator 14 shown in FIG. 3. In other words, the oscillator circuit 40Db includes, as compared with the oscillator circuit 40Da shown in FIG. 12, the current source 12A shown in FIG. 3 in place of the current source 12 shown in FIG. 2. The other configuration of the oscillator circuit 40Db is similar to that shown in FIG. 12 except for the following respects.

The current source 12A-1 includes the switch SW1 controlled by the controller 25, and the current source 12A-2 includes the switch SW2 controlled by the controller 25. In addition, the gate voltage of each of the P channel MOSFETs P1 and P2 of the current source 12A-1 is applied as the reference voltage Vref1 to the inverting input terminal of the comparator 17. Further, the gate voltage of each of the P channel MOSFETs P1 and P2 of the current source 12A-2 are applied as the reference voltage Vref1 to the inverting input terminal of the comparator 18.

Figure 14:
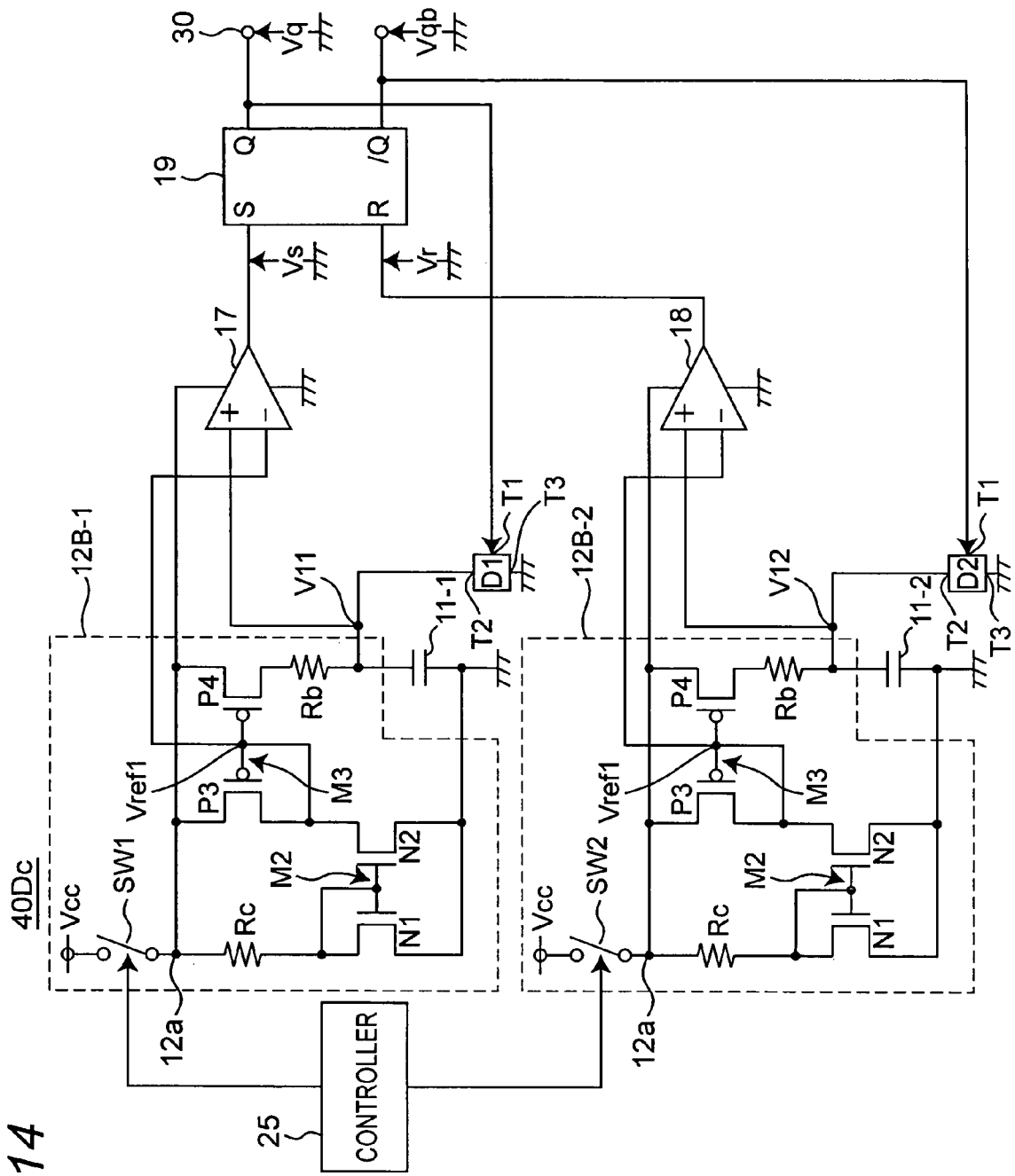
FIG. 14 is a circuit diagram showing a configuration of a third implemental example 40Dc of the oscillator circuit 40D shown in FIG. 11.

FIG. 14 is a circuit diagram showing a configuration of a third implemental example 40Dc of the oscillator circuit 40D shown in FIG. 11. In FIG. 14, the oscillator circuit 40Dc is characterized by being constituted by using (a) current sources 12B-1 and 12B-2 each having a configuration similar to that of the current source 12B shown in FIG. 4, and (b) the two comparators 17 and 18 each having a configuration similar to that of the comparator 14 shown in FIG. 4. In other words, the oscillator circuit 40Dc includes, as compared with the oscillator circuit 40Da shown in FIG. 12, the current source 12B shown in FIG. 4 in place of the current source 12 shown in FIG. 2. The other configuration of the oscillator circuit 40Dc is similar to that shown in FIG. 12 except for the following respects. The current source 12B-1 includes the switch SW1 controlled by the controller 25, and the current source 12B-2 includes the switch SW2 controlled by the controller 25.

Figure 15:
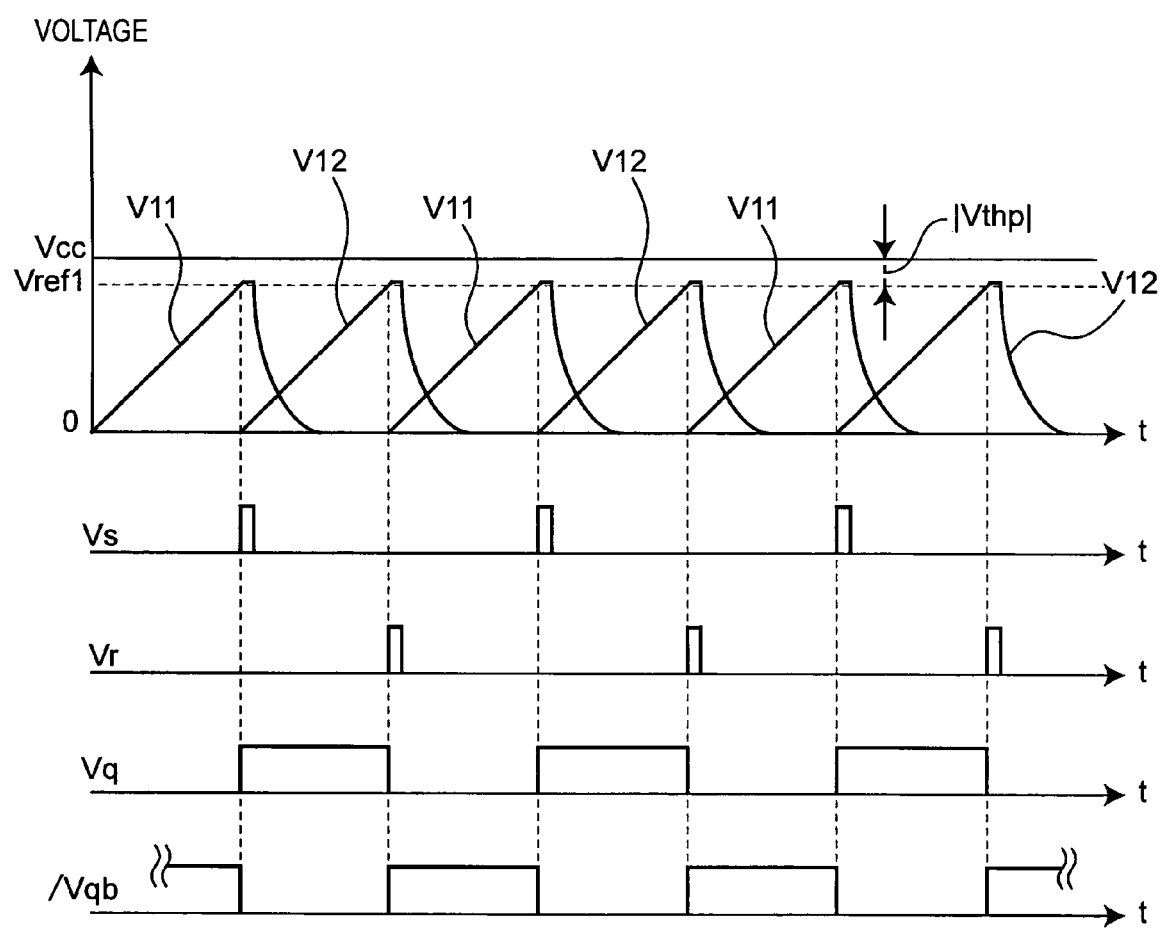
FIG. 15 is a timing chart showing an operation of the oscillator circuit 40D shown in FIG. 11.

FIG. 15 is a timing chart showing an operation of the oscillator circuit 40D shown in FIG. 11.

Referring to FIG. 15, the controller 25 turns on the switch SW1 after the oscillator circuit 40D starts operating, and turns on the switch SW2 at a timing delayed by a predetermined time interval. In this case, the capacitor 11-1 is first of all charged with electric charges. Thereafter, when the voltage V11 between the both ends of the capacitor 11-1 or the voltage V11 across the capacitor 11-1 is equal to or higher than the reference voltage Vref, the comparator 17 outputs the high-level pulse signal to the set terminal S of the set-reset flip-flop 19. At that time, the set-reset flip-flop 19 is set, the predetermined high-level signal Vq is outputted from the non-inverting output terminal Q of the flip-flop 19 to the output terminal 30 and the control terminal T1 of the discharge circuit D1. In addition, the predetermined low-level signal Vqb is outputted from the inverting output terminal /Q of the flip-flop 19 to the output terminal 31 and the control terminal T1 of the discharge circuit D2. At that time, the discharge circuit D1 is turned on, and the electric charges as stored in the capacitor 11-1 are discharged. On the other hand, the discharge circuit D2 is turned off, the current from the current source 12-2 flows into the capacitor 11-2, and the electric charges are stored in the capacitor 11-2.

Thereafter, when the capacitor 11-2 is charged with the electric charges and the voltage V12 across the capacitor 11-2 is equal to or higher than the reference voltage Vref, the comparator 18 outputs the high-level pulse signal to the reset terminal R of the set-reset flip-flop 19. At that time, the set-reset flip-flop 19 is reset, the predetermined low-level signal Vq is outputted from the non-inverting output terminal Q of the flip-flop 19 to the output terminal 30 and the control terminal T1 of the discharge circuit D1. In addition, the predetermined high-level signal Vqb is outputted from the inverting output terminal /Q of the flip-flop 19 to the output terminal 31 and the control terminal T1 of the discharge circuit D2. In this case, the discharge circuit D1 is turned off, and the charging is started again. On the other hand, the discharge circuit D2 is turned on, and the electric charges as stored in the capacitor 11-2 are discharged. The above-described operation is repeated, and the high-level signal having a predetermined pulse width is outputted as the signal Vq outputted from the output terminal 30 at a predetermined cycle or period, namely, a predetermined oscillation signal is outputted.

In the oscillator circuit as thus constituted, in response to the reset signal, the voltage across the capacitor 11-1 rises substantially in proportion to the elapsed time by charging the capacitor 11-1 with the electric charges and reaches the reference voltage Vref. Thereafter, in response to the set signal, the voltage across the capacitor 11-1 falls from the reference voltage Vref according to the elapsed time by discharging electric charges from the capacitor 11-1. Then, in response to the set signal, the voltage across the capacitor 11-2 rises substantially in proportion to the elapsed time by charging the capacitor 11-2 and reaches the reference voltage Vref. Thereafter, in response to the reset signal, the voltage across the capacitor 11-2 falls from the reference voltage Vref according to the elapsed time by discharging electric charges from the capacitor 11-2. By repeating the above-mentioned operation, the two output signals Vq and Vqb from the set-reset flip-flop 19 can be outputted as oscillation signals each having a predetermined cycle or period.

As described above, the oscillator circuit of the semiconductor circuit according to the third preferred embodiment of the present invention executes the operation of the oscillator circuit including the operation of the timer circuit according to the first preferred embodiment by using the charging current from the current sources 12, 12A or 12B and the reference voltage Vref from the current sources 12, 12A or 12B according to the first preferred embodiment. Therefore, even when the power supply voltage Vcc decreases, the charging current dependent on the power supply voltage Vcc decreases. On the other hand, the reference voltage Vref also decreases which is obtained when the power supply voltage Vcc is dropped through the dropping resistance by the drop voltage. Accordingly, the time hardly changes which is a time, from a timing when the voltage across each of the capacitors 11-1 and 11-2 rises substantially in proportion to the elapsed time by charging each of the capacitors 11-1 and 11-2, to a timing when the same voltage reaches the reference voltage Vref. In other words, the oscillator circuit can operate with keeping or holding the oscillation cycle or period thereof even when the power supply voltage Vcc decreases. Therefore, it is possible to provide the oscillator circuit that can operate stably in the wide range of the power supply voltage from the lower voltage.

Fourth Preferred Embodiment

Figure 16:
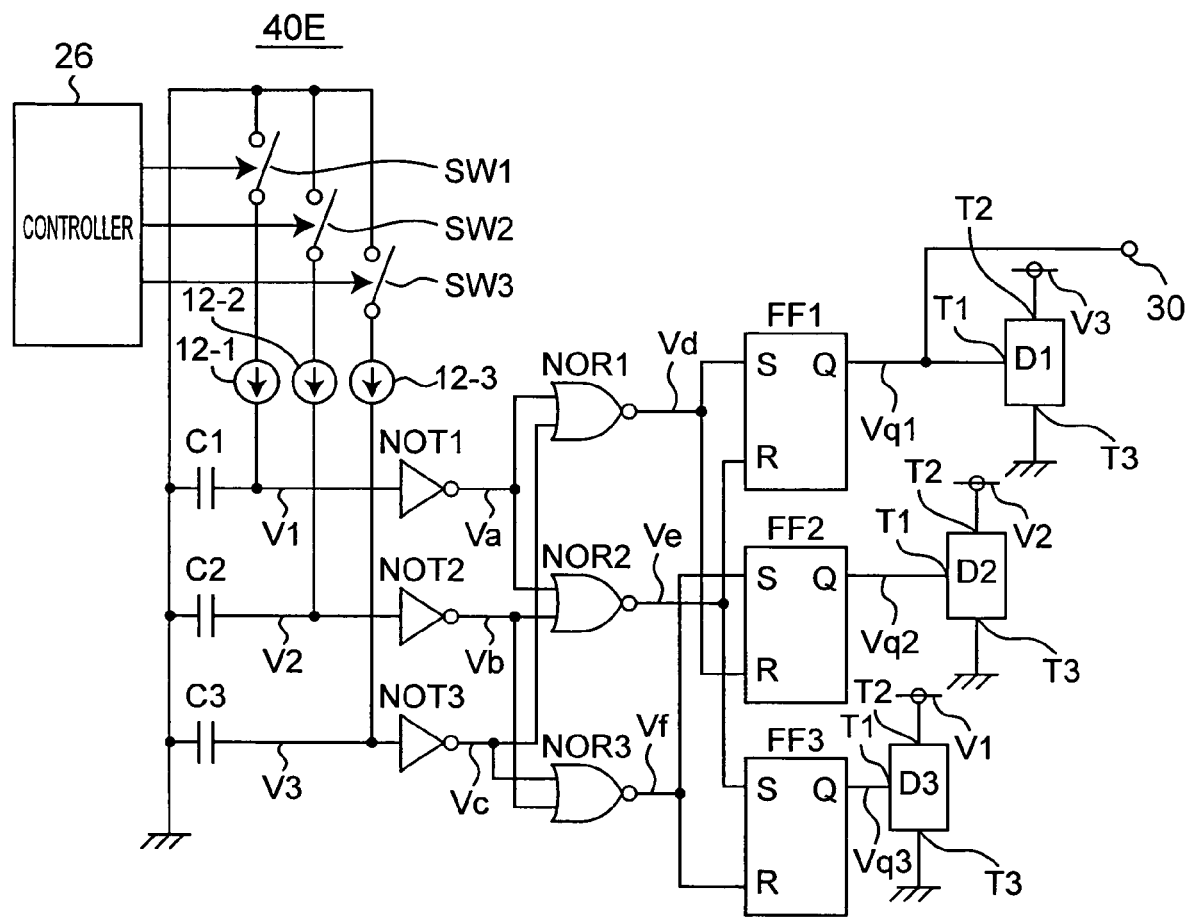
FIG. 16 is a circuit diagram showing a configuration of an oscillator circuit 40E of a semiconductor circuit according to a fourth preferred embodiment of the present invention.

FIG. 16 is a circuit diagram showing a configuration of an oscillator circuit 40E of a semiconductor circuit according to a fourth preferred embodiment of the present invention. The oscillator circuit 40E shown in FIG. 16 is characterized, as compared with the oscillator circuit 40D shown in FIG. 11, by being constituted by including the following:

(a) three current sources 12-1, 12-2 and 12-3,
(b) three inverters NOT1, NOT2 and NOT3,
(c) three set-reset flip-flop FF1, FF2 and FF3, and
(d) three discharge circuits D1, D2 and D3.

It is noted that each of the current sources 12-1, 12-2 and 12-3 is constituted by the CMOS circuit in a manner similar to that of the current source 12, and each of the discharge circuits D1, D2 and D3 is constituted in a manner similar to that of the discharge circuit D1.

Referring to FIG. 16, one end of the current source 12-1 is grounded via the switch SW1, and another end of the current source 12-1 is grounded via a capacitor C1. One end of the current source 12-2 is grounded via the switch SW2, and another end of the current source 12-2 is grounded via a capacitor C2. One end of the current source 12-3 is grounded via a switch SW3, and another end of the current source 12-3 is grounded via a capacitor C3. Further, the voltage V1 between both ends of the capacitor C1 or the voltage V1 across the capacitor C1 is applied to the discharge circuit D3, and is inputted as a voltage Va to a first input terminal of a NOR gate NOR1 and a first input terminal of a NOR gate NOR2 via an inverter NOT1. The voltage V2 between both ends of the capacitor C2 or the voltage across the capacitor C2 is applied to the discharge circuit D2, and is inputted as a voltage Vb to a second input terminal of the NOR gate NOR2 and a second input terminal of a NOR gate NOR3 via an inverter NOT2. The voltage V3 between both ends of the capacitor C3 or the voltage V3 across the capacitor C3 is applied to the discharge circuit D1, and is inputted as a voltage Vc to a second input terminal of the NOR gate NOR1 and a first input terminal of the NOR gate NOR3 via an inverter NOT3. It is noted that each of the invertors NOT1, NOT2, and NOT3 outputs an inverted low-level signal when a signal inputted thereto is equal to or higher than a predetermined threshold voltage. In this case, the threshold voltage of each of the inverters NOT1, NOT2, and NOT3 is preferably set to a voltage value obtained when the power supply voltage Vcc is dropped through the dropping resistance by the threshold voltage Vthp of a P channel MOSFET in a manner similar to that of the preceding preferred embodiments.

The output signal outputted from the NOR gate NOR1 is outputted as a voltage Vd to the set terminal S of the set-reset flip-flop FF1 and the reset terminal R of the set-reset flip-flop FF2. The output signal outputted from the NOR gate NOR2 is outputted as a voltage Ve to the reset terminal R of the set-reset flip-flop FF1 and the set terminal S of the set-reset flip-flop FF3. The output signal outputted from the NOR gate NOR3 is outputted as a voltage Vf to the set terminal S of the set-reset flip-flop FF2 and the reset terminal R of the set-reset flip-flop FF3. Further, the output signal outputted from the non-inverting output terminal Q of the set-reset flip-flop FF1 is outputted as a voltage Vq1 to the output terminal 30, and is outputted to the control terminal T1 of the discharge circuit D1. The output signal outputted from the non-inverting output terminal Q of the set-reset flip-flop FF2 is outputted as a voltage Vq2 to the control terminal T1 of the discharge circuit D2. The output signal outputted from the non-inverting output terminal Q of the set-reset flip-flop FF3 is outputted as a voltage Vq3 to the control terminal T1 of the discharge circuit D3. It is noted that a controller 26 turns on the switch SW1 after the oscillator circuit 40E starts operating, and the controller 26 turns on the switch SW2 at a timing delayed by a predetermined time interval. Further, the controller 26 turns on the switch SW3 at a timing delayed by the same time interval.

Figure 17:
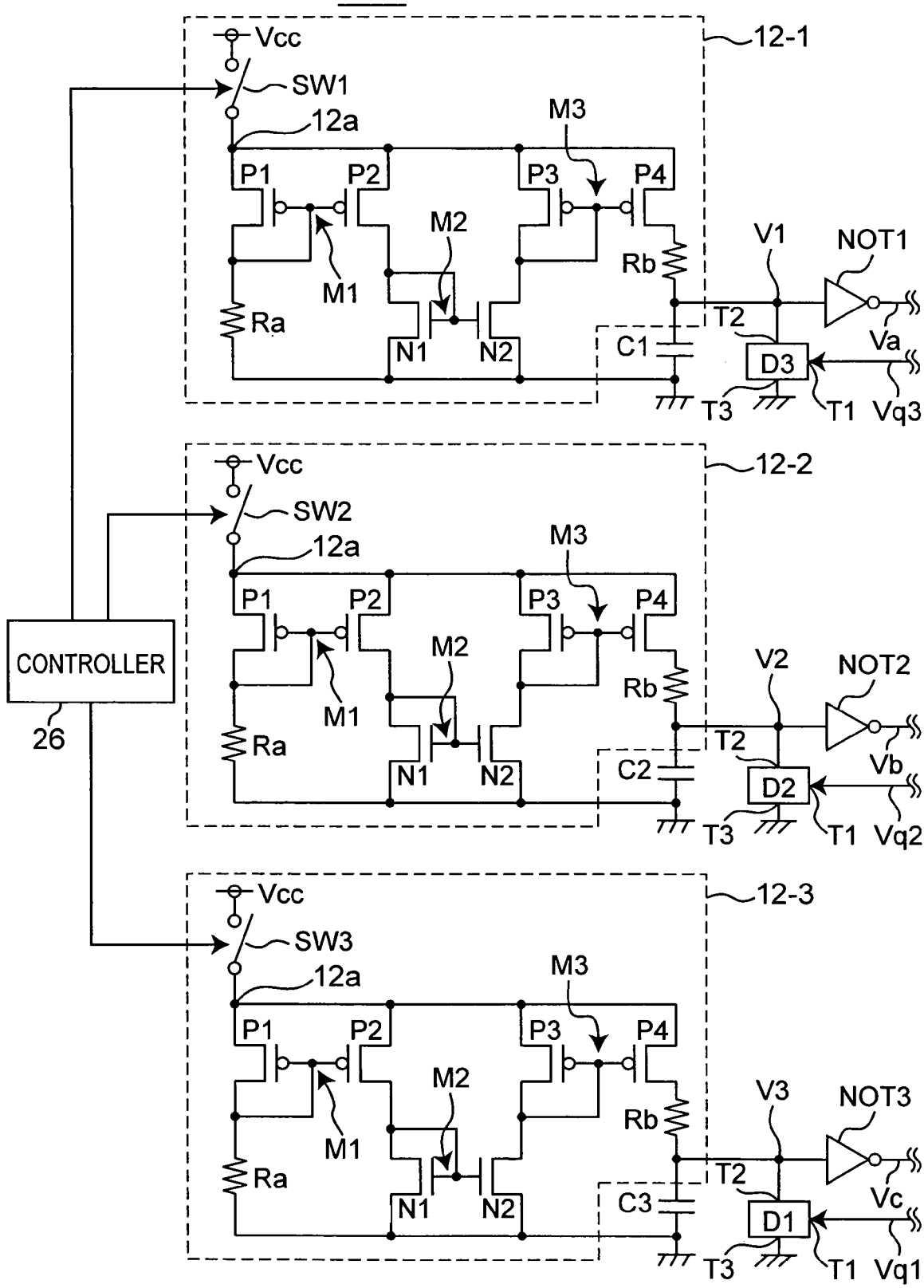
FIG. 17 is a circuit diagram showing a configuration of a first implemental example 40Ea of the oscillator circuit 40E shown in FIG. 16.

FIG. 17 is a circuit diagram showing a configuration of a first implemental example 40Ea of the oscillator circuit 40E shown in FIG. 16. FIG. 17 shows only a circuit of the oscillator circuit 40E from the controller 26, to the inverters NOT1, NOT2 and NOT3, and the discharge circuits D1 D2 and D3. The oscillator circuit 40Ea shown in FIG. 17 is characterized by being constituted by using the three current sources 12-1, 12-2 and 12-3 each having a configuration similar to that of the current source 12 shown in FIG. 2.

Referring to FIG. 17, the current source 12-1 includes the switch SW1 controlled by the controller 26, the current source 12-2 includes the switch SW2 controlled by the controller 26, and the current source 12-3 includes the switch SW3 controlled by the controller 26. The source of the P channel MOSFET P4 of the current source 12-1 is grounded via the resistor Rb and the capacitor C1, and the voltage V1 between the both ends of the capacitor C1 or the voltage V1 across the capacitor C1 is applied to the inverter NOT1 and the terminal T2 of the discharge circuit D3. The source of the P channel MOSFET P4 of the current source 12-2 is grounded via the resistor Rb and the capacitor C2, and the voltage V2 between the both ends of the capacitor C2 or the voltage V2 across the capacitor C2 is applied to the inverter NOT2 and the terminal T2 of the discharge circuit D2. The source of the P channel MOSFET P4 of the current source 12-3 is grounded via the resistor Rb and the capacitor C3, and the voltage V3 between the both ends of the capacitor C3 or the voltage V3 across the capacitor C3 is applied to the inverter NOT3 and the terminal T2 of the discharge circuit D1.

Figure 18:
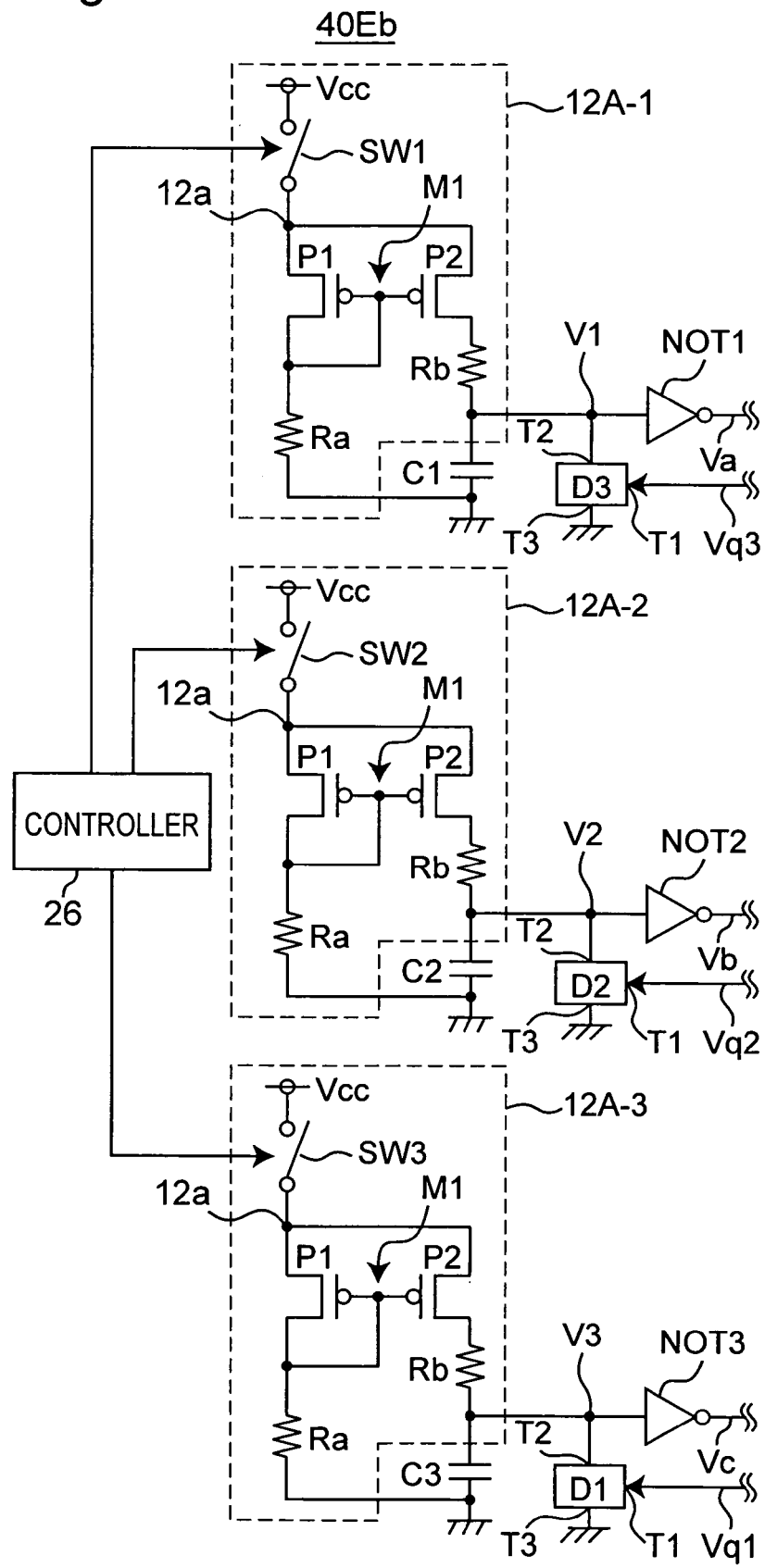
FIG. 18 is a circuit diagram showing a configuration of a second implemental example 40Eb of the oscillator circuit 40E shown in FIG. 16.

FIG. 18 is a circuit diagram showing a configuration of a second implemental example 40Eb of the oscillator circuit 40E shown in FIG. 16. FIG. 18 shows only a circuit of the oscillator circuit 40E from the controller 26, to the inverters NOT1, NOT2 and NOT3, and the discharge circuits D1, D2 and D3. The oscillator circuit 40Eb shown in FIG. 18 is characterized by being constituted by using three current sources 12A-1, 12A-2 and 12A-3 having a configuration similar to that of the current source 12A shown in FIG. 3. Referring to FIG. 18, the current source 12A-1 includes the switch SW1 controlled by the controller 26, the current source 12A-2 includes the switch SW2 controlled by the controller 26, and the current source 12A-3 includes the switch SW3 controlled by the controller 26. The other configuration of the oscillator circuit 40Eb is similar to that shown in FIG. 17.

Figure 19:
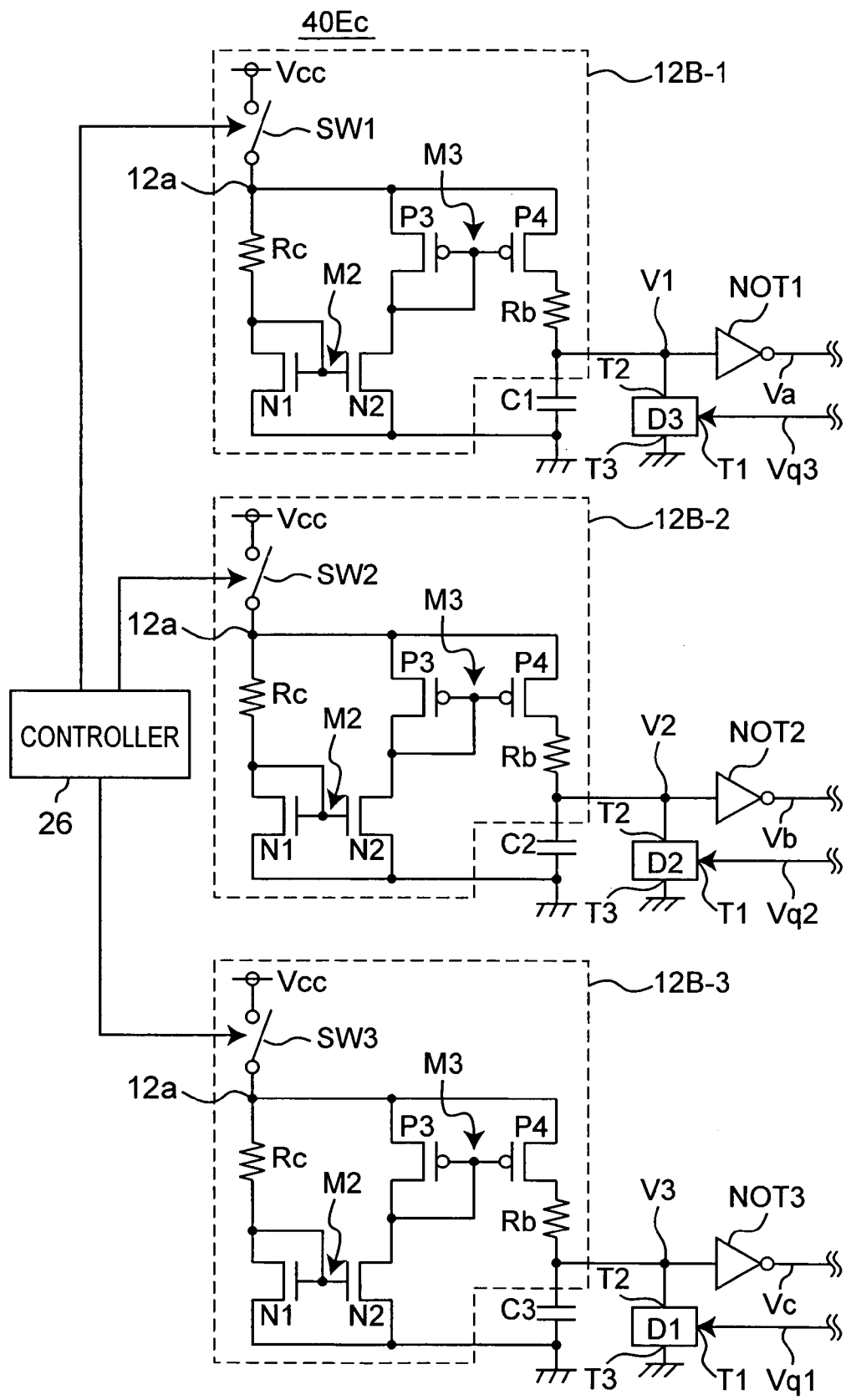
FIG. 19 is a circuit diagram showing a configuration of a third implemental example 40Ec of the oscillator circuit 40E shown in FIG. 16.

FIG. 19 is a circuit diagram showing a configuration of a third implemental example 40Ec of the oscillator circuit 40E shown in FIG. 16. FIG. 19 shows only a circuit of the oscillator circuit 40E from the controller 26, to the inverters NOT1, NOT2 and NOT3, and the discharge circuits D1, D2 and D3. The oscillator circuit 40Ec shown in FIG. 19 is characterized by being constituted by using three current sources 12B-1, 12B-2 and 12B-3 having a configuration similar to that of the current source 12B shown in FIG. 4. Referring to FIG. 19, the current source 12B-1 includes the switch SW1 controlled by the controller 26, the current source 12B-2 includes the switch SW2 controlled by the controller 26, and the current source 12B-3 includes the switch SW3 controlled by the controller 26. The other configuration of the oscillator circuit 40Ec is similar to those shown in FIGS. 17 and 18.

Figure 20:
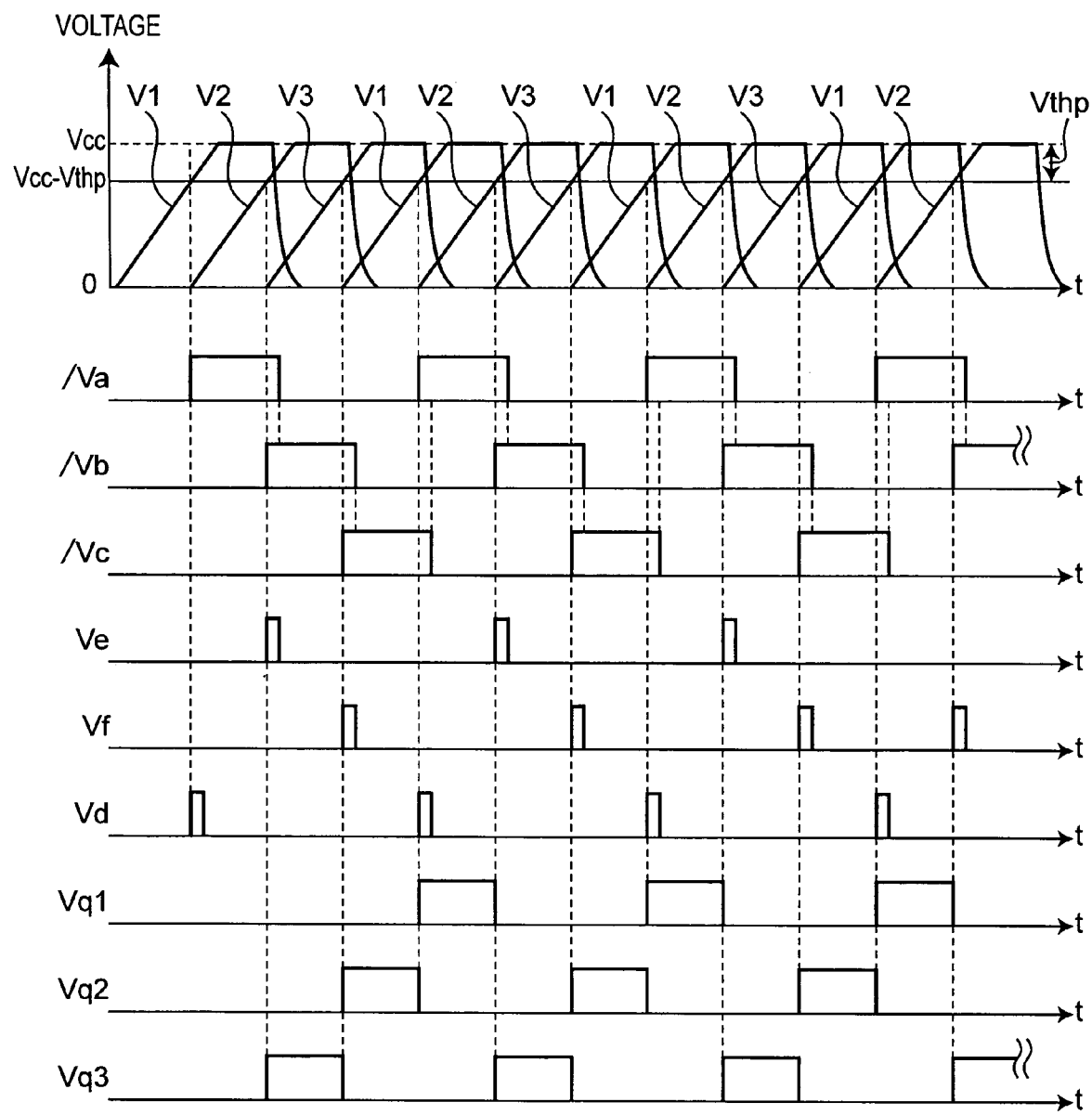
FIG. 20 is a timing chart showing an operation of the oscillator circuit 40E shown in FIG. 16.

FIG. 20 is a timing chart showing an operation of the oscillator circuit 40E shown in FIG. 16.

Referring to FIG. 20, the controller 26 turns on the switch SW after the oscillator circuit 40E starts operating, turns on the switch SW2 at the timing delayed by the predetermined time interval, and turns on the switch SW3 at the timing delayed by the same time interval. In this case, first of all, when the capacitor C1 is charged with electric charges and the voltage V1 across the capacitor C1 is equal to or higher than the threshold voltage of the inverter NOT1, the low-level signal Va is outputted from the inverter NOT1. When the capacitor C2 is charged with electric charges and the voltage V2 across the capacitor C2 is equal to or higher than the threshold voltage of the inverter NOT2, the low-level signal Vb is outputted from the inverter NOT2. When the capacitor C3 is charged with electric charges and the voltage V3 across the capacitor C3 is equal to or higher than the threshold voltage of the inverter NOT3, the low-level signal Vc is outputted from the inverter NOT3. The control of the controller 26 during start activation (when the power is turned on) is executed so that the low-level signal Va overlaps on the low-level signal Vb in a predetermined time interval, the low-level signal Vb overlaps on the low-level signal Vc in a predetermined time interval, and the low-level signal Vc overlaps on the low-level signal Va in the next cycle in a predetermined time interval. In FIG. 20, the low-level signals Va, Vb and Vc are indicated by /Va, /Vb and /Vc in a form of low active signal for simplification of the drawings.

As described above, the low-level signals Va, Vb and Vc are sequentially outputted so as to be overlapped onto each other. Therefore, the high pulse signals Ve, Vf and Vd are sequentially outputted with the same cycle or period in an order of the NOR gates NOR2, NOR3 and NOR1. In response to this, the high-level output signal Vq3 from the set-reset flip-flop FF3, the high-level output signal Vq2 from the set-reset flip-flop FF2, and the high-level output signal Vq1 from the set-reset flip-flop FF1 are sequentially outputted. It is noted that discharging of the electric charges from each of the discharge circuits D1, D2 and D3 is repeatedly turned on and off. Therefore, as shown in FIG. 20, the above-described operation is repeated, and the high-level signal having a predetermined pulse width is outputted in the predetermined cycle as the signal Vq1 outputted from the output terminal 30, namely, a predetermined oscillation signal is generated.

In the oscillator circuit 40E shown in FIG. 16 according to the fourth preferred embodiment, there is shown an implemental example which utilizes the three current sources 12-1, 12-2 and 12-3. Alternatively, a similar oscillator circuit may be constituted by using four or more current sources and element circuits corresponding to the respective current sources.

In the present oscillator circuit, such an operation is repeated for the respective capacitors C1, C2 and C3 shifted from each other by the time intervals, that in response to the reset signal, the voltages of the respective capacitors C1, C2 and C3 rise substantially in proportion to the elapsed time by charging them and reach the reference voltage Vref, and in response to the set signal, fall from the reference voltage Vref according to the elapsed time by discharging electric charges from the capacitors C1, C2 and C3. This leads to that the signals outputted from the respective set-reset flip flops FF1, FF2 and FF3 can be outputted as oscillation signals each having a predetermined cycle or period.

As described above, the oscillator circuit of the semiconductor circuit according to the fourth preferred embodiment of the present invention executes the operation of the oscillator circuit including the operation of the timer circuit according to the first preferred embodiment by using the charging current from the current sources 12, 12A or 12B and the reference voltage Vref from the current sources 12, 12A or 12B according to the first preferred embodiment. Therefore, even when the power supply voltage Vcc decreases, the charging current dependent on the power supply voltage Vcc decreases, and the reference voltage Vref decreases which is obtained when the power supply voltage Vcc is dropped through the dropping resistance by the drop voltage decreases. Accordingly, the time hardly changes which is a time, from a timing when the voltage across each of the capacitors C1, C2 and C3 rises substantially in proportion to the elapsed time by charging them, to a timing when the same capacitor voltage reaches the reference voltage Vref hardly changes. In other words, the oscillator circuit can operate with keeping or holding the oscillation cycle or period of the oscillator circuit even when the power supply voltage Vcc decreases. Therefore, it is possible to provide the oscillator circuit that can operate stably in the wide range of the power supply voltage from the lower voltage.

Fifth Preferred Embodiment

Figure 21:
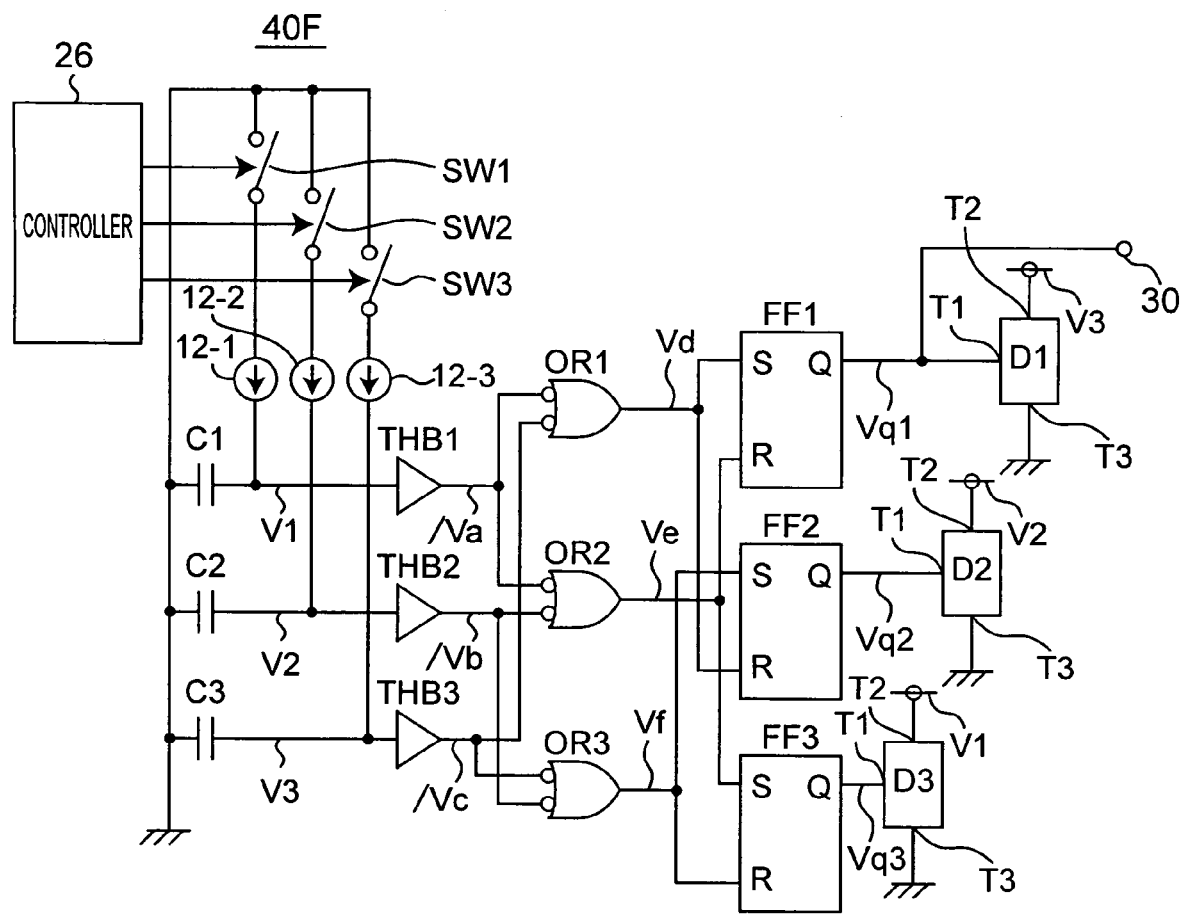
FIG. 21 is a circuit diagram showing a configuration of an oscillator circuit 40F of a semiconductor circuit according to a fifth preferred embodiment of the present invention.

FIG. 21 is a circuit diagram showing a configuration of an oscillator circuit 40F of a semiconductor circuit according to a fifth preferred embodiment of the present invention. The oscillator circuit 40F shown in FIG. 21 is characterized, as compared with the oscillator circuit 40E shown in FIG. 16, by the following:

(a) including threshold buffers THB1, THB2 and THB3 in place of the inverters NOT1, NOT2 and NOT3;

(b) including OR gates OR1, OR2 and OR3 each including two inverting input terminals in place of the NOR gates NOR1, NOR2 and NOR3.

The oscillator circuit 40F thus constituted operates in a manner similar to that of the oscillator circuit 40E except that the output signals Va, Vb and Vc are inverted as compared with the oscillator circuit 40E shown in FIG. 16.

In the oscillator circuit 40F shown in FIG. 21 according to the fifth preferred embodiment, there is shown an implemental example which utilizes the three current sources 12-1, 12-2 and 12-3. Alternatively, a similar oscillator circuit may be constituted by using four or more current sources and element circuits corresponding to the respective current sources.

Figure 22:
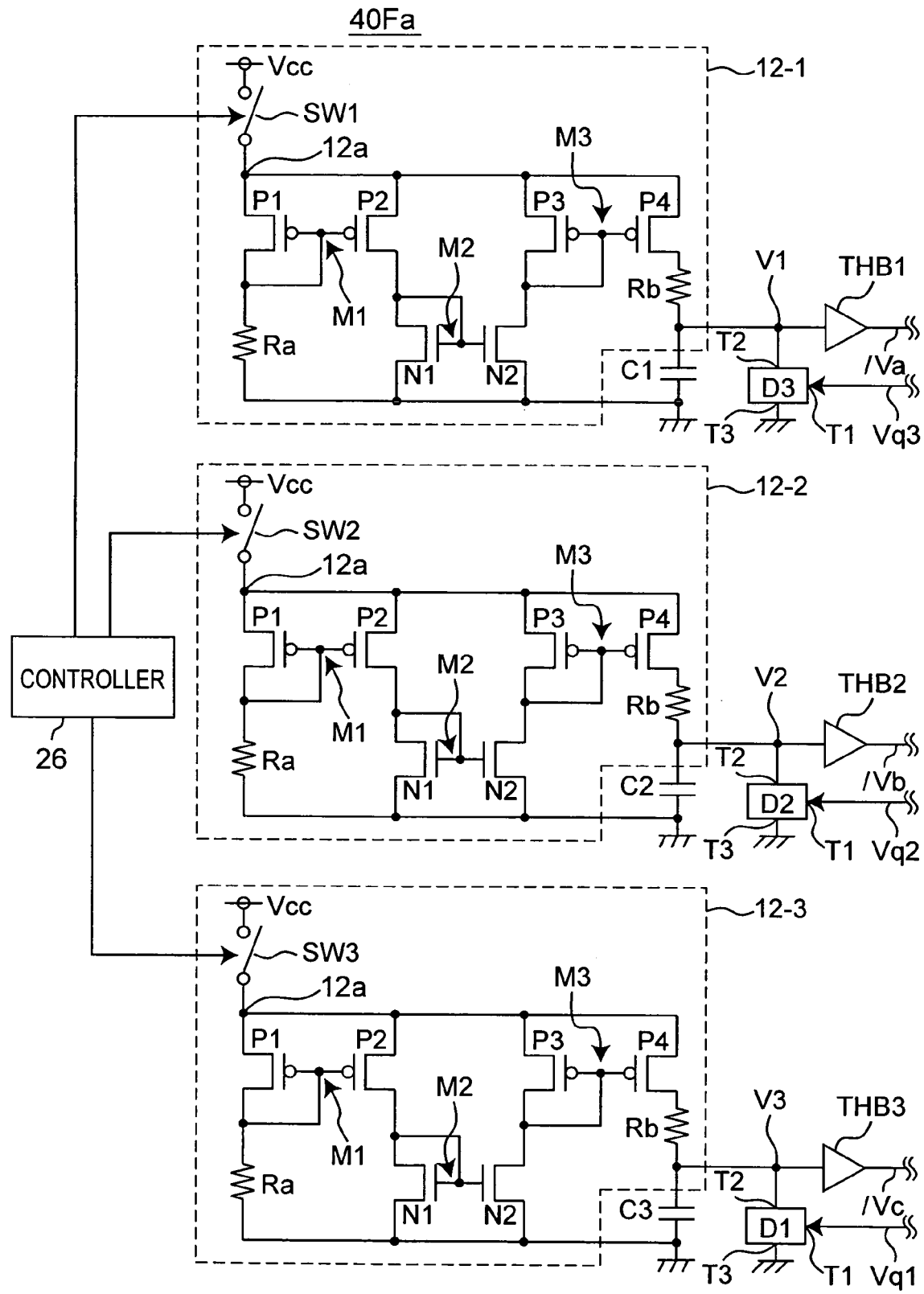
FIG. 22 is a circuit diagram showing a configuration of a first implemental example 40Fa of the oscillator circuit 40F shown in FIG. 21.

FIG. 22 is a circuit diagram showing a configuration of a first implemental example 40Fa of the oscillator circuit 40F shown in FIG. 21. FIG. 22 shows only a circuit of the oscillator circuit 40F from the controller 26, to the threshold buffers THB1, THB2 and THB3, and the discharge circuits D1, D2 and D3. The oscillator circuit 40Fa shown in FIG. 22 is characterized by being constituted by using the three current sources 12-1, 12-2 and 12-3 each having a configuration similar to that of the current source 12 shown in FIG. 2. The oscillator circuit 40Fa shown in FIG. 22 differs from the oscillator circuit 40Ea shown in FIG. 17 only in that the oscillator circuit 40Fa includes the threshold buffers THB1, THB2 and THB3 in place of the inverters NOT1, NOT2 and NOT3, respectively.

Figure 23:
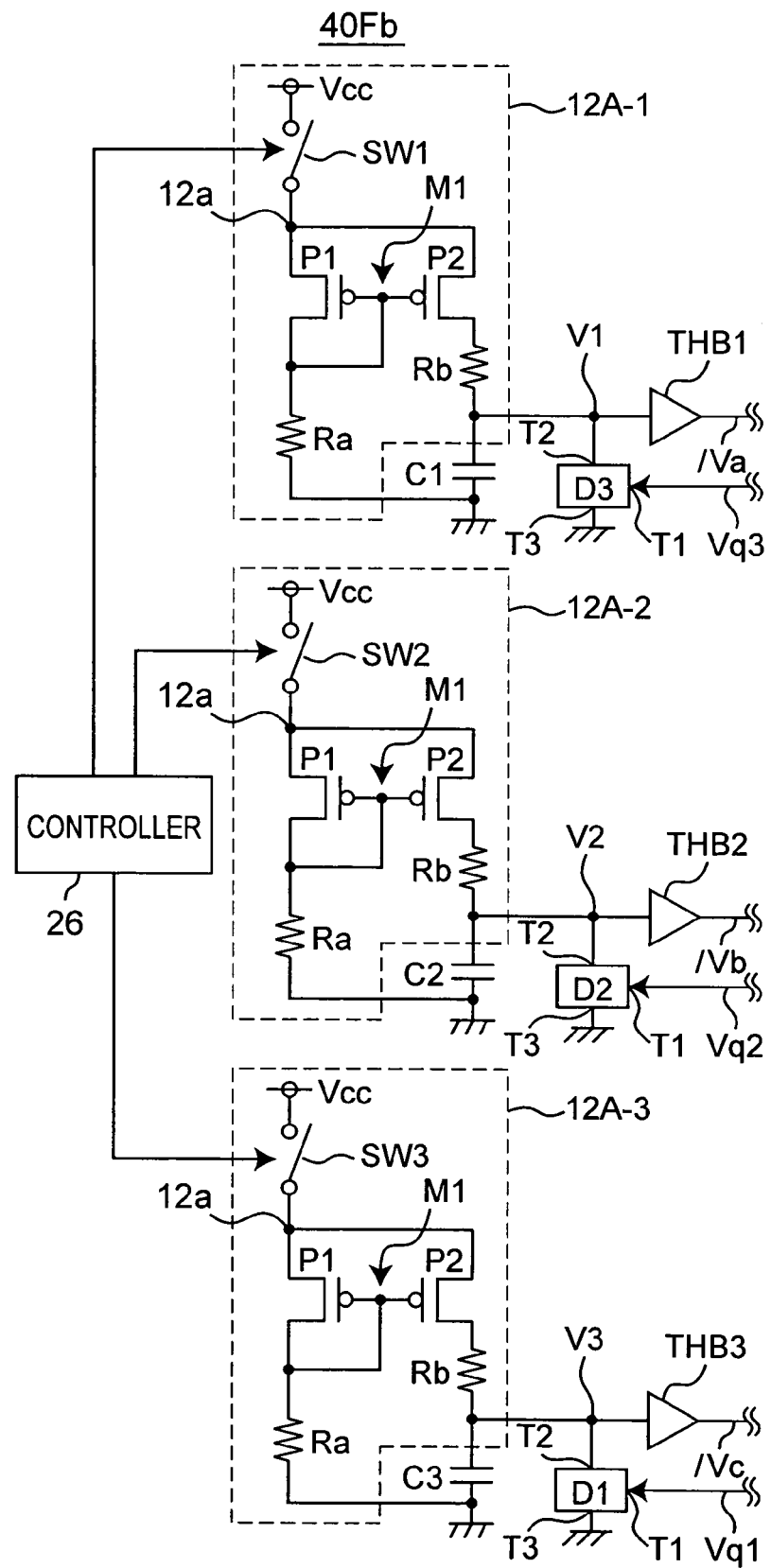
FIG. 23 is a circuit diagram showing a configuration of a second implemental example 40Fb of the oscillator circuit 40F shown in FIG. 21.

FIG. 23 is a circuit diagram showing a configuration of a second implemental example 40Fb of the oscillator circuit 40F shown in FIG. 21. FIG. 23 shows only a circuit of the oscillator circuit 40F from the controller 26, to the threshold buffers THB1, THB2 and THB3, and the discharge circuits D1, D2 and D3. The oscillator circuit 40Fb shown in FIG. 23 is characterized by being constituted by using the three current sources 12A-1, 12A-2 and 12A-3 having a configuration similar to that of the current source 12A shown in FIG. 3. The oscillator circuit 40Fb shown in FIG. 23 differs from the oscillator circuit 40Eb shown in FIG. 18 only in that the oscillator circuit 40Fb includes the threshold buffers THB1, THB2 and THB3 in place of the inverters NOT1, NOT2 and NOT3, respectively.

Figure 24:
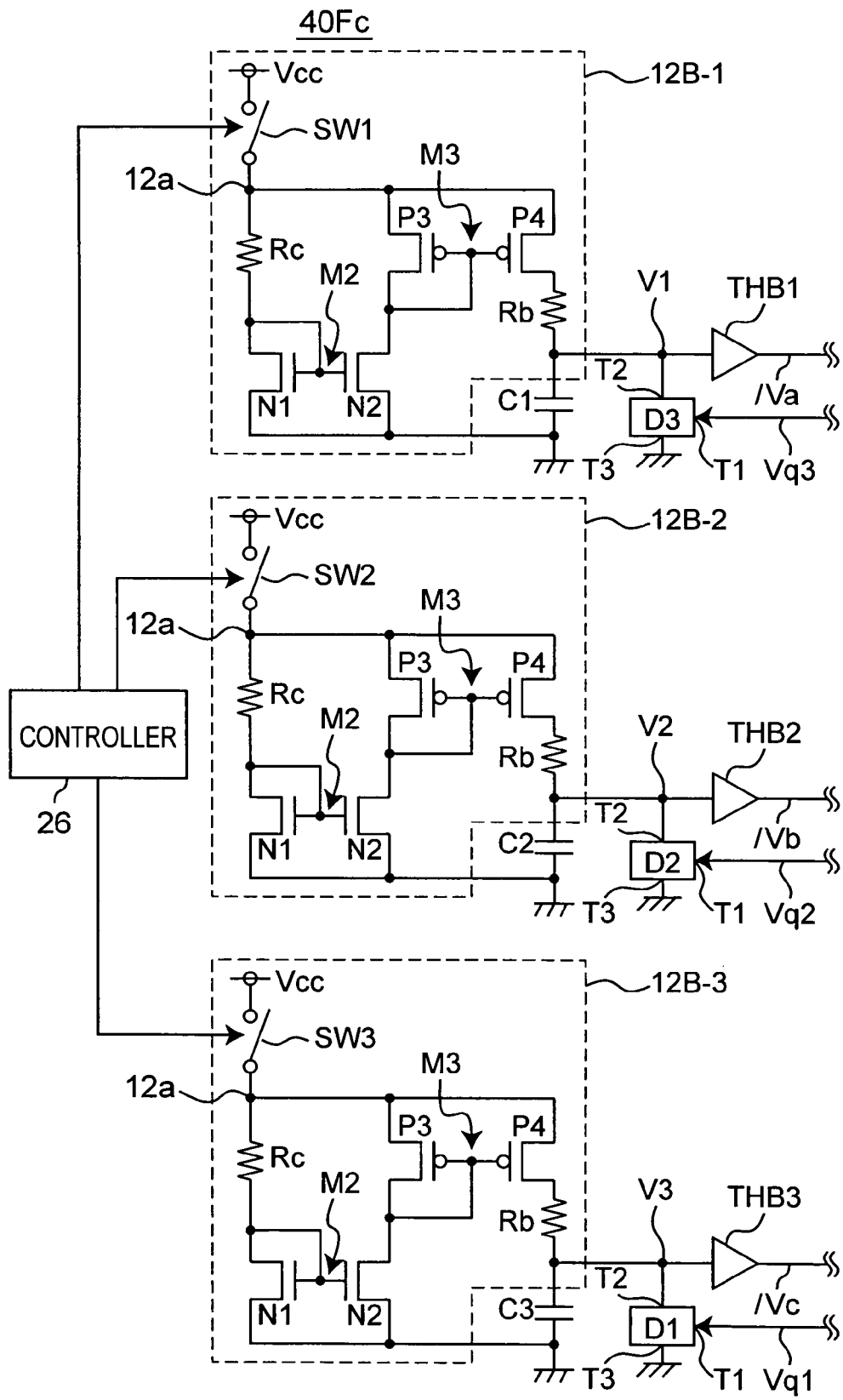
FIG. 24 is a circuit diagram showing a configuration of a third implemental example 40Fc of the oscillator circuit 40F shown in FIG. 21.

FIG. 24 is a circuit diagram showing a configuration of a third implemental example 40Fc of the oscillator circuit 40F shown in FIG. 21. FIG. 24 shows only a circuit of the oscillator circuit 40F from the controller 26, to the threshold buffers THB1, THB2 and THB3, and the discharge circuits D1, D2 and D3. The oscillator circuit 40Fc shown in FIG. 24 is characterized by being constituted by using the three current sources 12B-1, 12B-2 and 12B-3 each having a configuration similar to that of the current source 12B shown in FIG. 4. The oscillator circuit 40Fc shown in FIG. 24 differs from the oscillator circuit 40Ec shown in FIG. 19 only in that the oscillator circuit 40Fc includes the threshold buffers THB1, THB2 and THB3 in place of the inverters NOT1, NOT2 and NOT3, respectively.

As described above, the oscillator circuit of the semiconductor circuit according to the fifth preferred embodiment of the present invention exhibits the same actions and advantageous effects as those of the fourth preferred embodiment. Therefore, there can be provided the oscillator circuit that can operate with keeping or holding the oscillation cycle or period of the oscillator circuit even when the power supply voltage Vcc decreases, and that can operate stably in the wide range of the power supply voltage from the lower voltage.

INDUTRIAL APPLICABABILITY

As described above in detail, according to the semiconductor circuit according to the present invention, the capacitor is charged with electric charges by using the current source that is driven by the power supply voltage, that outputs the current dependent on the power supply voltage, and that outputs a reference voltage as obtained when the power supply voltage is dropped through the dropping resistance by a predetermined drop voltage. The comparator compares the voltage across the capacitor with the reference voltage outputted from the current source, and outputs the output signal when the voltage across the capacitor is equal to or higher than the reference voltage. The timer circuit outputs the output signal after the delay time which is a time, from a timing when supply of the power supply voltage is started, to a timing when the voltage across the capacitor rises substantially in proportion to the elapsed time by charging the capacitor and reaches the reference voltage.

Accordingly, even when the power supply voltage decreases, the charging current dependent on the power supply voltage decreases, and the reference voltage decreases which is a voltage as obtained when the power supply voltage is dropped through the dropping resistance by the drop voltage. In this case, the delay time hardly changes which is such a time as, from the timing when the voltage across the capacitor rises substantially in proportion to the elapsed time by charging the capacitor, to a timing when the same voltage reaches the reference voltage. In other words, even when the power supply voltage decreases, the semiconductor circuit can operate with keeping the delay time of the timer circuit. Accordingly, the present invention can provide the timer circuit capable of operating stably within a wide range of the power supply voltage from a lower voltage.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor circuit comprising:
a current source that is driven by a power supply voltage, said current source outputting a current dependent on the power supply voltage, and said current source outputting a reference voltage as obtained when the power supply voltage is dropped by a predetermined drop voltage, wherein said current source comprises:
    a current mirror circuit including a first P channel MOSFET and a second P channel MOSFET,
    a first resistors, and
    a second resistor, wherein said first P channel MOSFET and said first resistor are interposed between the power supply voltage and a ground, wherein said current source outputs as the reference voltage, an output voltage across said first resistor that is a voltage as obtained when the power supply voltage is dropped by a threshold voltage of said first P channel MOSFET, and wherein said current source outputs the current flowing from the power supply voltage to said capacitor via said second P channel MOSFET and said second resistor;
a capacitor that is charged with electric charges by the current outputted from said current source; and
a comparator for comparing a voltage across said capacitor with the reference voltage outputted from said current source, and for outputting an output signal when a voltage across said capacitor is equal to or higher than the reference voltage, wherein the semiconductor circuit constitutes a timer circuit that outputs an output signal after a delay time that is equal to such a time as, from a timing when supply of the power supply voltage is started, to a timing when the voltage across said capacitor rises substantially in proportion to an elapsed time by charging said capacitor and reaches the reference voltage.

2. A semiconductor circuit comprising:
a current source that is driven by a power supply voltage, said current source outputting a current dependent on the power supply voltage, and said current source outputting a reference voltage as obtained when the power supply voltage is dropped by a predetermined drop voltage, wherein said current source comprises:
    a first current mirror circuit including a first N channel MOSFET and a second N channel MOSFET,
    a second current mirror circuit including a first P channel MOSFET and a second P channel MOSFET,
    a first resistor, and
    a second resistor, wherein said first current mirror circuit and said second current mirror circuit are cascade-connected to each other, wherein said first resistor and said first N channel MOSFET are interposed between the power supply voltage and a ground, wherein said current source outputs as the reference voltage, an output voltage as obtained, when a voltage across said first N channel MOSFET, that is a voltage as obtained when the power supply voltage is dropped by said first resistor, is outputted via said second N channel MOSFET, and wherein said current source outputs the current flowing from the power supply voltage to said capacitor via said second P channel MOSFET and said second resistor;
a capacitor that is charged with electric charges by the current outputted from said current source; and
a comparator for comparing a voltage across said capacitor with the reference voltage outputted from said current source, and for outputting an output signal when a voltage across said capacitor is equal to or higher than the reference voltage, wherein the semiconductor circuit constitutes a timer circuit that outputs an output signal after a delay time that is equal to such a time as, from a timing when supply of the power supply voltage is started, to a timing when the voltage across said capacitor rises substantially in proportion to an elapsed time by charging said capacitor and reaches the reference voltage.

3. A semiconductor circuit comprising:
a current source that is driven by a power supply voltage, said current source outputting a current dependent on the power supply voltage, and said current source outputting a reference voltage as obtained when the power supply voltage is dropped by a predetermined drop voltage, wherein said current source comprises:
    a first current mirror circuit including a first P channel MOSFET and a second P channel MOSFET, a second current mirror circuit including a first N channel MOSFET and a second N channel MOSFET,
a third current mirror circuit including a third P channel MOSFET and a fourth P channel MOSFET,
a first resistor, and
a second resistor, wherein said first current mirror circuit, said second current mirror circuit, and said third current mirror circuit are cascade-connected to each other, wherein said first P channel MOSFET and said first resistor are interposed between the power supply voltage and a ground, wherein said current source outputs as the reference voltage, an output voltage as obtained, when a voltage across said first resistor, that is a voltage as obtained when the power supply voltage is dropped by a threshold value of said first P channel MOSFET, is outputted via said second P channel MOSFET and said second current mirror circuit, and wherein said current source outputs the current flowing from the power supply; voltage to said capacitor via said fourth P channel MOSFET and said second resistor
a capacitor that is charged with electric charges by the current outputted from said current source; and
a comparator for comparing a voltage across said capacitor with the reference voltage outputted from said current source, and for outputting an output signal when a voltage across said capacitor is equal to or higher than the reference voltage, wherein the semiconductor circuit constitutes a timer circuit that outputs an output signal after a delay time that is equal to such a time as, from a timing when supply of the power supply voltage is started, to a timing when the voltage across said capacitor rises substantially in proportion to an elapsed time by charging said capacitor and reaches the reference voltage.

4. A semiconductor circuit comprising:
a current source that is driven by a power supply voltage, said current source outputting a current dependent on the power supply voltage, said current source outputting a first reference voltage as obtained when the power supply voltage is dropped by a predetermined first drop voltage, said current source outputting a second reference voltage as obtained when the first reference voltage is dropped by a predetermined second drop voltage, wherein said current source comprises:
a first current mirror circuit including a first N channel MOSFET and a second N channel MOSFET,
a second current mirror circuit including a first P channel MOSFET and a second P channel MOSFET,
a first resistors, and
a second resistor, wherein said first current mirror circuit and said second current mirror circuit are cascade-connected to each other, wherein said first resistor and said first N channel MOSFET are interposed between the power supply voltage and a ground, wherein said current source outputs as the second reference voltage, a voltage across said first N channel MOSFET that is a voltage as obtained when the power supply voltage is dropped by said first resister, and said current source outputs as the first reference voltage, an output voltage as obtained when the second reference voltage is outputted via said second N channel MOSFET, and wherein said current source outputs the current flowing from the power supply voltage to said capacitor via said second P channel MOSFET and said second resistors:
a capacitor that is charged with electric charges by the current outputted from said current source;
a first comparator for comparing a voltage across said capacitor with the first reference voltage, and for outputting a set signal when the voltage across said capacitor is eaual to or higher than the first reference voltage;
a second comparator for comparing the voltage across said capacitor with the second reference voltage, and for outputting a reset signal when the voltage across said capacitor is equal to or lower than the second reference voltage;
a set-reset flip-flop that is set in response to the set signal, and is reset in response to the reset signal, said set-reset flip-flop outputting an output signal during a time interval, from a timing when the set-reset flip-flop is set, to a timing when the set-reset flip-flop is reset; and
a discharge circuit for discharging the electric charges from said capacitor in response to the set signal, wherein the semiconductor circuit constitutes an oscillator circuit that outputs the output signal outputted from said set-reset flip-flop as an oscillation signal having a predetermined cycle by repeating such an operation that, in response to the reset signal, the voltage across said capacitor rises from the second reference voltage substantially in proportion to an elapsed time by charging said capacitor, and reaches the first reference voltage, and thereafter, in response to the set signal, the voltage across said capacitor falls from the first reference voltage according to the elapsed time by discharging the electric charges from said capacitor and reaches the second reference voltage.

5. A semiconductor circuit comprising:
a current source that is driven by a power supply voltage, said current source outputting a current dependent on the power supply voltage, said current source outputting a first reference voltage as obtained when the power supply voltage is dropped by a predetermined first drop voltage, said current source outputting a second reference voltage as obtained when the first reference voltage is dropped by a predetermined second drop voltage, wherein said current source comprises:
a first current mirror circuit including a first P channel MOSFET and a second P channel MOSFET,
a second current mirror circuit including a first N channel MOSFET and a second N channel MOSFET,
a third current mirror circuit including a third P channel MOSFET and a fourth P channel MOSFET,
a first resistors, and
a second resistor, wherein said first current mirror circuit, said second current mirror circuit, and said third current mirror circuit are cascade-connected to each other, wherein said first P channel MOSFET and said first resistor are interposed between the power supply voltage and a ground, wherein said current source outputs as the second reference voltage, an output voltage as obtained when a voltage across said first resistor, that is a voltage as obtained when the power supply voltage is dropped by a threshold value of said first P channel MOSFET, is outputted via said second P channel MOSFET, and said current source outputs as the first reference voltage, an output voltage as obtained when the second reference voltage is outputted via said second current mirror circuit, and wherein said current source outputs the current flowing from the power supply voltage to said capacitor via said fourth P channel MOSFET and said second resistor;
a capacitor that is charged with electric charges by the current outputted from said current source;
a first comparator for comparing a voltage across said capacitor with the first reference voltage, and for outputting a set signal when the voltage across said capacitor is equal to or higher than the first reference voltage;

a second comparator for comparing the voltage across said capacitor with the second reference voltage, and for outputting a reset signal when the voltage across said capacitor is equal to or lower than the second reference voltage;

a set-reset flip-flop that is set in response to the set signal, and is reset in response to the reset signal, said set-reset flip-flop outputting an output signal during a time interval, from a timing when the set-reset flip-flop is set, to a timing when the set-reset flip-flop is reset; and a discharge circuit for discharging the electric charges from said capacitor in response to the set signal, wherein the semiconductor circuit constitutes an oscillator circuit that outputs the output signal outputted from said set-reset flip-flop as an oscillation signal having a predetermined cycle by repeating such an operation that, in response to the reset signal, the voltage across said capacitor rises from the second reference voltage substantially in proportion to an elapsed time by charging said capacitor, and reaches the first reference voltage, and thereafter, in response to the set signal, the voltage across said capacitor falls from the first reference voltage according to the elapsed time by discharging the electric charges from said capacitor and reaches the second reference voltage.

6. The semiconductor circuit according to claim 4 or 5, wherein said discharge circuit is constituted by an N channel MOSFET.

7. A semiconductor circuit comprising: N current sources where N is an integer of three or more, each of said N current sources being driven by a power supply voltage, each of said N current sources outputting a current dependent on the power supply voltage, each of said N current sources outputting a reference voltage as obtained when the power supply voltage is dropped by a predetermined drop voltage, each of said N current sources starting operating at a timing delayed to each other by a predetermined time interval; N capacitors that are charged with electric charges by the currents outputted from said N current sources, respectively; N set-reset flip-flops, each of said N set-reset flip-flops being set in response to a set signal, each of said N set-reset flip-flops being reset in response to a reset signal, each of said N set-reset flip-flops outputting an output signal during a time interval, from a timing when each said set-reset flip-flop is set, to a timing when each said set-reset flip-flop is reset, N threshold elements, each of said N threshold elements outputting a threshold result signal when a voltage of the signal outputted from each of said N capacitors is equal to or higher than a predetermined threshold value; N gate elements, each of said N gate elements outputting a simultaneous output signal indicating that the threshold result signals from each pair of threshold elements among the N threshold elements are simultaneously outputted, as the set signal and the reset signal for corresponding pair of set-reset flip-flops among said N set-reset flip-flops; and N discharge circuits, each of said N discharge circuits discharging the electric charges from said N capacitors in response to the output signals outputted from said N set-reset flip-flops, respectively, wherein the semiconductor circuit constitutes an oscillator circuit that outputs the output signal outputted from each of said set-reset flip-flops as an oscillation signal having a predetermined cycle by repeating such an operation with shifting by the time interval in each of said capacitors that, in response to the reset signal, the voltage across each of said capacitors rises substantially in proportion to an elapsed time by charging each of said capacitors, and reaches the reference voltage, and thereafter, in response to the set signal, the voltage across said capacitor falls from the reference voltage according to the elapsed time by discharging the electric charges from each of said capacitors.

8. The semiconductor circuit according to claim 7, wherein each of said threshold elements is an inverter, and wherein each of said gate elements is a NOR gate.

9. The semiconductor circuit according to claim 7, wherein each of said threshold elements is a threshold buffer, and wherein each of said gate elements is an OR gate including an inverting input terminal.

10. The semiconductor circuit according to claim 7, wherein each of said current sources comprises: a current mirror circuit including a first P channel MOSFET and a second P channel MOSFET; a first resistor; and a second resistor, wherein said first P channel MOSFET and said first resistor are interposed between the power supply voltage and a ground, wherein each of said current sources outputs as the reference voltage, a voltage across said first resistor as obtained when the power supply voltage is dropped by a threshold value of said first P channel MOSFET, and wherein each of said current sources outputs the current flowing from the power supply voltage to said capacitor via said second P channel MOSFET and said second resistor.

11. The semiconductor circuit according to claim 7, wherein each of said current sources comprises: a first current mirror circuit including a first N channel MOSFET and a second N channel MOSFET; a second current mirror circuit including a first P channel MOSFET and a second P channel MOSFET; a first resistor; and a second resistor, and wherein said first current mirror circuit and said second current mirror circuit are cascade-connected to each other, wherein said first resistor and said first N channel MOSFET are interposed between the power supply voltage and a ground, wherein each of said current sources outputs as the reference voltage, an output voltage as obtained when a voltage across said first N channel MOSFET, that is a voltage obtained when the power supply voltage is dropped by the first resister, is outputted via said second N channel MOSFET, and wherein each of said current sources outputs the current flowing from the power supply voltage to said capacitor via said second P channel MOSFET and said second resistor.

12. The semiconductor circuit according to claim 7, wherein each of said current sources comprises: a first current mirror circuit including a first P channel MOSFET and a second P channel MOSFET; a second current mirror circuit including a first N channel MOSFET and a second N channel MOSFET; a third current mirror circuit including a third P channel MOSFET and a fourth P channel MOSFET; a first resistor; and a second resistor, wherein said first current mirror circuit, said second current mirror circuit, and said third current mirror circuit are cascade-connected to each other, wherein said first P channel MOSFET and said first resistor are interposed between the power supply voltage and a ground, wherein each of said current sources outputs as the reference voltage, an output voltage as obtained when a voltage across said first resister, that is a voltage as obtained when the power supply voltage is dropped by a threshold value of said first P channel MOSFET, is outputted via said second P channel MOSFET and said second current mirror circuit, and wherein each of said current sources outputs the current flowing from the power supply voltage to said capacitor via said fourth P channel MOSFET and said second resistor.

13. The semiconductor circuit according to claim 7, wherein each of said discharge circuits is constituted by an N channel MOSFET.

\* \* \* \* \*